United States Patent
Doi

(10) Patent No.: US 9,584,349 B2
(45) Date of Patent: Feb. 28, 2017

(54) TRANSMISSION CIRCUIT

(71) Applicant: NEC Corporation, Tokyo (JP)

(72) Inventor: Yoshiaki Doi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 14/894,127

(22) PCT Filed: May 19, 2014

(86) PCT No.: PCT/JP2014/063200
§ 371 (c)(1),
(2) Date: Nov. 25, 2015

(87) PCT Pub. No.: WO2014/192574
PCT Pub. Date: Dec. 4, 2014

(65) Prior Publication Data
US 2016/0127162 A1 May 5, 2016

(30) Foreign Application Priority Data
May 31, 2013 (JP) ................................. 2013-115437

(51) Int. Cl.
*H04B 1/04* (2006.01)
*H04L 27/20* (2006.01)
(Continued)

(52) U.S. Cl.
CPC ....... *H04L 27/2092* (2013.01); *H03F 3/2175* (2013.01); *H04L 27/361* (2013.01); *H03F 2200/331* (2013.01)

(58) Field of Classification Search
CPC ... H04L 1/0003; H04L 1/0071; H04L 1/0009; H04L 5/0009; H04L 27/0008;
(Continued)

(56) References Cited

U.S. PATENT DOCUMENTS

2002/0186440 A1* 12/2002 Adachi ..................... H03F 3/24
398/183
2005/0110562 A1 5/2005 Robinson et al.
(Continued)

FOREIGN PATENT DOCUMENTS

JP 2003-500873 1/2003
JP 2005-57665 3/2005
(Continued)

OTHER PUBLICATIONS

E. Umali et al., "Power Spectral Analysis of the Envelope Pusle-Width Modulation (EPWM) Transmitter for High Efficiency Amplification of OFDM Signals", IEEE Vehicular Technology Conference, pp. 1261-1265, 2008.
(Continued)

*Primary Examiner* — Dac Ha
(74) *Attorney, Agent, or Firm* — Finnegan, Henderson, Farabow, Garrett & Dunner, L.L.P.

(57) ABSTRACT

The transmission circuit includes a comparator that converts a phase-modulated signal from an orthogonal modulator into a pulse signal so as to use the pulse signal as the sampling clock of the a delta-sigma modulator, and an asynchronous clock transfer unit and an interpolating circuit, disposed between a circuit operating based on the baseband clock and the delta-sigma modulator. The asynchronous clock transfer unit converts the amplitude component signal synchronized with the baseband clock, into an amplitude component signal synchronized with an N-frequency divided clock obtained by dividing the frequency of the sampling clock by N. The interpolating circuit interpolates the output signal from the asynchronous clock transfer unit so that the amount of change of one sample in the N-frequency divided clock becomes equal to the amount of change of one sample in the sampling clock.

20 Claims, 16 Drawing Sheets

(51) Int. Cl.
*H04L 27/36* (2006.01)
*H03F 3/217* (2006.01)

(58) Field of Classification Search
CPC ......... H04L 27/2092; H03L 7/00; H03K 7/10;
H03K 17/98; H04B 14/004; H04B
14/006; H03M 11/20; H03M 11/003;
H03M 11/02; G06F 3/023
See application file for complete search history.

(56) References Cited

U.S. PATENT DOCUMENTS

| 2007/0160164 | A1* | 7/2007 | Sahota | H03C 5/00 |
|---|---|---|---|---|
| | | | | 375/295 |
| 2012/0257670 | A1 | 10/2012 | Nagatani et al. | |
| 2012/0262214 | A1* | 10/2012 | Hori | H03F 3/217 |
| | | | | 327/291 |

FOREIGN PATENT DOCUMENTS

| JP | 2005-244950 | 9/2005 |
|---|---|---|
| JP | 2006-148964 | 6/2006 |
| JP | 2006-333450 | 12/2006 |
| JP | 3878029 | 2/2007 |
| JP | 2007-511187 | 4/2007 |
| JP | 4394620 | 1/2010 |
| JP | 2011-135200 | 7/2011 |
| WO | WO 2011/078120 A1 | 6/2011 |
| WO | WO 2013/035523 A1 | 3/2013 |

OTHER PUBLICATIONS

A. Frappe et al., "A digital ΔΣ RF signal generator for mobile communication transmitters in 90nm CMOS", IEEE Radio Frequency Integrated Circuits Symposium, pp. 13-16, 2008.
International Search Report mailed Jul. 29, 2014 in corresponding PCT International Application.

* cited by examiner

Fig.13-a
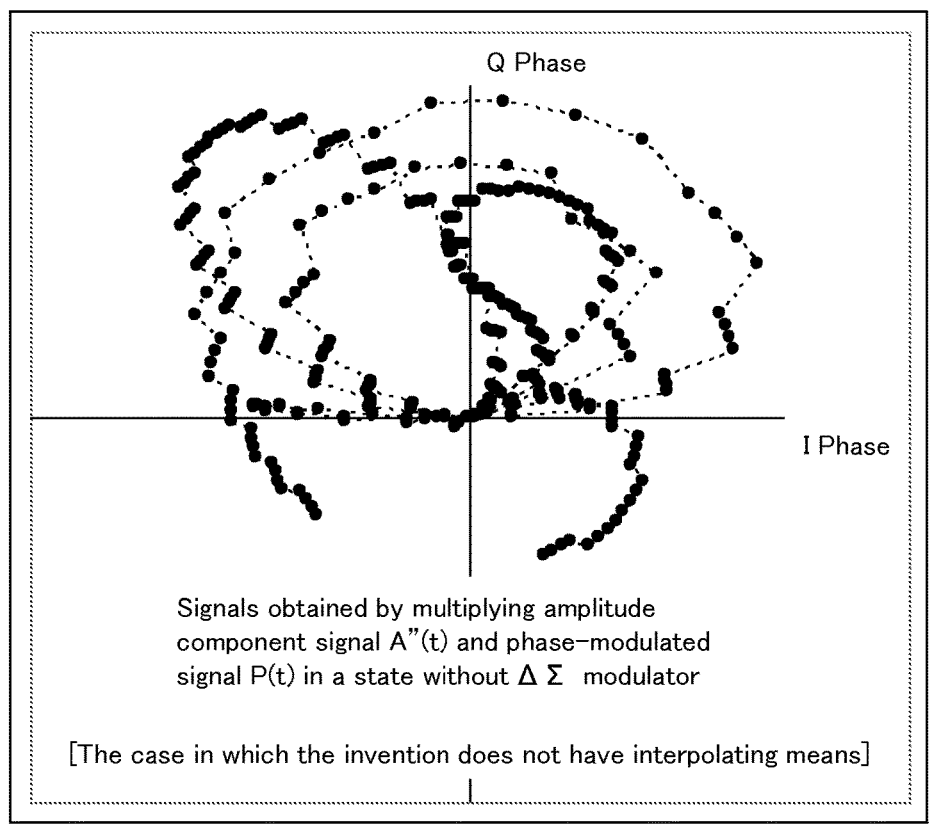

Fig.13-b
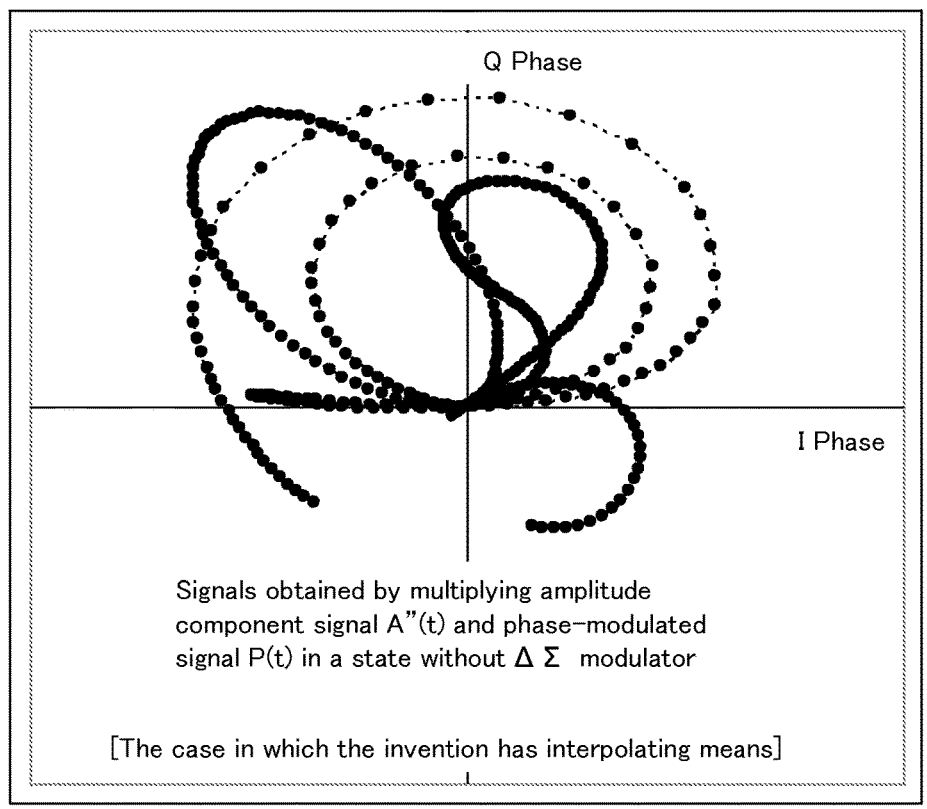

TRANSMISSION CIRCUIT

CROSS-REFERENCE TO RELATED PATENT APPLICATIONS

This application is a National Stage Entry of International Application No. PCT/JP2014/063200, filed May 19, 2014, which claims priority from Japanese Patent Application No. 2013-115437, filed May 31, 2013. The entire contents of the above-referenced applications are expressly incorporated herein by reference.

TECHNICAL FIELD

The present invention relates to a transmission circuit for use in a transmission device in a radio communication system.

BACKGROUND ART

The transmission device in a radio communications system includes a transmission circuit that amplifies a signal obtained from an orthogonal baseband signal and transmits the resultant signal. A transmission circuit with improved efficiency is needed in order to realize greater miniaturization and low power consumption.

Under such circumstances, in the recent years the transmission circuit using a delta-sigma modulator has attracted attention because high power efficiency switching amplifiers, for example those, represented by class-D amplifiers and class-E amplifiers are adopted as power amplifiers. Here in this description, the term 'delta-sigma modulator' indicates both the delta-sigma modulator and the sigma-delta modulator.

In general, when orthogonal baseband signals I(t) and Q(t) are subjected to orthogonal modulation with a carrier wave frequency fc from an oscillator by means of an orthogonal modulator, the orthogonally modulated signal e(t) can be represented by the following expression 1.

[Math 1]

$$e(t) = I(t) \cdot \cos(2\pi f_c t) - Q(t) \cdot \sin(2\pi f_c t) \quad \text{(Ex. 1)}$$

It is assumed herein that the amplitude (amplitude component) of the baseband signal can be represented by A(t) as in the following expression 2, the phase (angular component) of the baseband signal can be represented by θ(t) as in the following expression 3, the modulated signal e(t) of the above Ex. 1 can be replaced by the following expression 4.

[Math 2]

$$A(t) = \sqrt{I(t)^2 + Q(t)^2} \quad \text{(Ex. 2)}$$

[Math 3]

$$\theta(t) = \tan^{-1}\left\{\frac{Q(t)}{I(t)}\right\} \quad \text{(Ex. 3)}$$

[Math 4]

$$e(t) = A(t) \cdot \{\cos(\theta(t)) \cdot \cos(2\pi f_c t) - \sin(\theta(t)) \cdot \sin(2\pi f_c t)\} \quad \text{(Ex. 4)}$$
$$= A(t) \cdot \cos\{2\pi f_c t + \theta(t)\}$$

The above Ex. 4 is equivalent to the result of multiplication between the phase modulated signal P(t) having an amplitude of 1, represented by the following expression 5 and the amplitude component signal A(t) of the above Ex. 2.

[Math 5]

$$P(t) = \cos\{2\pi f_c t + \theta(t)\} \quad \text{(Ex. 5)}$$

Here, when the orthogonal baseband signals I(t) and Q(t) are converted by the following expressions 6 and 7, angular component signals I'(t) and Q'(t) that have an amplitude of 1 and that only show angular component information can be obtained.

[Math 6]

$$I'(t) = \left\{\frac{I(t)}{\sqrt{I(t)^2 + Q(t)^2}}\right\} \quad \text{(Ex. 6)}$$

[Math 7]

$$Q'(t) = \left\{\frac{Q(t)}{\sqrt{I(t)^2 + Q(t)^2}}\right\} \quad \text{(Ex. 7)}$$

The phase modulation signal P(t) in Ex. 5 is equal to the signal which is obtained by performing orthogonal modulation on angular component signals I'(t) and Q'(t) with carrier wave frequency fc by means of an orthogonal modulator.

Accordingly, the modulated signal e(t) can be obtained in the following manner. First, orthogonal baseband signals I(t) and Q(t) are separated into amplitude component signal A(t) represented by the above Ex. 2 and angular component signals I'(t) and Q'(t) represented by the above Exs. 6 and 7. Subsequently, angular component signals I'(t) and Q'(t) are orthogonally modulated with the carrier wave frequency fc by means of an orthogonal modulator to obtain phase modulated signal P(t). Thereafter, phase modulated signal P(t) is multiplied by amplitude component signal A(t) to thereby obtain modulated signal e(t).

When, with the above configuration, amplitude component signal A(t) is subjected to delta-sigma modulation as described below, it is possible to realize a high-efficient transmission circuit using a switching amplifier.

FIG. 1 shows a configuration of a related art transmission circuit described in Patent Document 1.

As shown in FIG. 1, the transmission circuit described in Patent Document 1 includes phase modulator 1a, multiplier 2a, delta-sigma modulator 3a, band pass filter (BPF: Band Pass Filter) 4a, pre-processing circuit 6, switching amplifier 7, oscillators 8 and 9. Here, switching amplifier 7 is denoted as "PA (Power Amplifier)" in FIG. 1.

In Patent Document 2, as shown in FIG. 2 a transmission circuit equivalent to the transmission circuit shown in FIG. 1 from which switching circuit 7 is omitted is described. In FIG. 2, frequency modulator 1b, amplitude modulator 2b, delta-sigma modulator 3b, band pass filter 4b and data generator 5 are equivalent to phase modulator 1a, multiplier 2a, delta-sigma modulator 3a, band pass filter 4a and pre-processing circuit 6 shown in FIG. 1.

Therefore, the following description will be given on only the transmission circuit described in Patent Document 1 shown in FIG. 1.

Pre-processing circuit 6 separates orthogonal baseband signals I(t) and Q(t) into amplitude component signal A(t), angular component signal I'(t) and Q'(t) and outputs the resultant signals.

Phase modulator 1a corresponds to an orthogonal modulator and generates phase modulation signal P(t) from angular component signals I'(t) and Q'(t).

Delta-sigma modulator 3a subjects amplitude component signal A(t) to delta-sigma modulation to convert the signal into amplitude pulse modulated signal A'(t).

Multiplier 2a performs amplitude modulation on phase modulated signal P(t) with amplitude pulse modulated signal A'(t). As a result, multiplier 2a outputs a signal obtained by performing on-off modulation on phase-modulated signal P(t) of a fixed amplitude in accordance with information of "1" and "0" of amplitude pulse modulated signal A'(t). Accordingly, the amplitude of the output signal from multiplier 2a takes 0 or a constant value.

Switching amplifier 7 amplifies the output signal from multiplier 2a. The amplitude of the output signal from the multiplier 2a takes 0 or a constant value as stated above. Accordingly, even when the output signal from multiplier 2a is amplified by amplifier 7, the resultant signal will not involve any distortion accompanied by nonlinearity of the power amplifier and the signal can be amplified and transmitted at high power efficiency that switching amplifier 7 can inherently offer.

Here, amplitude pulse modulated signal A'(t) is a delta-sigma modulated signal that is obtained by subjecting amplitude component signal A(t) to delta-sigma modulation through delta-sigma modulator 3a. Therefore, as shown in the following expression 8, amplitude pulse modulated signal A'(t) is given as the sum of the amplitude component signal A(t) as the input signal to delta-sigma modulator 3a and the quantization noise N(t) accompanied by one-bit pulse modulation.

[Math 8]

$$A'(t)=A(t)+N(t) \quad \text{(Ex. 8)}$$

When amplitude pulse modulated signal A'(t) is used to perform amplitude modulation on phase modulated signal P(t) by means of multiplier 2a, the output signal from multiplier 2a also involves quantization noise.

It is assumed that Q(t) represents the quantization noise arising from quantization and Q(z) represents the Z-transform of Q(t). For example, when a first order delta-sigma modulator is employed as delta-sigma modulator 3a, residual noise N(z) in the output of the first order delta-sigma modulator can be represented by the following expression 9 based on the noise shaping characteristics in transmission characteristics of the first order delta-sigma modulator.

[Math 9]

$$N(z)=(1-Z^{-1}) \cdot Q(z) \quad \text{(Ex. 9)}$$

Here, in the above Ex. 9, $Z^{-1}$ means one sample delay in the clock rate of delta-sigma modulator 3a.

Accordingly, the Z-transform of the above Ex. 8 is written as the following expression 10.

[Math 10]

$$A'(z)=A(z)+(1-Z^{-1}) \cdot Q(z) \quad \text{(Ex. 10)}$$

In other words, the above Ex. 9 is the expression representing the noise-shaping characteristics of delta-sigma modulator 3a for shifting the noise on the low-frequency side (the transmission signal band) of quantization noise Q(z) that is uniformly distributed over the frequency axis, to the high-frequency side (the outside of the transmission signal band).

Optimization of the noise-shaping characteristics of delta-sigma modulator 3a represented by the above Ex. 9 makes it possible to reduce and to eliminate quantization noise by band pass filter 4a downstream of switching amplifier 7.

Here, the noise-shaping characteristics of delta-sigma modulator 3a is determined depending on the order of delta-sigma modulation and the over sampling ratio (OSR: Over Sampling Ratio). However, if this noise-shaping characteristics have not been optimized, a problem occurs in which noise remaining in the lower frequency (in the transmission signal band) than the stopband of band pass filter 4a spoils the radio characteristics required for the transmission equipment.

Non-Patent Document 1 related to Patent document 1 describes the conditions required for a delta-sigma modulator to yield the characteristics of the desired signal-to-noise ratio for IEEE (Institute of Electrical and Electronic Engineers) 802.11b OFDM (Orthogonal Frequency Division Multiplexing) signals. Specifically, in the example of Non-Patent Document 1, even in the simulation level, a delta-sigma modulator is required to operate at a clock frequency set by an OSR of 32 (i.e., 640 MHz) or by an OSR of 64 (i.e., 1.28 GHz) for the sampling frequency 20 MHz in the original baseband signal.

In general, FPGAs (Field Programmable Gate Array) and ASICs (Application Specific Integrated Circuit) for processing the baseband signal have the advantage in which logic and filter circuits can be easily configured. However, the operation clock frequency (including not only the core but also input and output) of FPGAs and ASICs reach 200 MHz to 400 MHz at the highest even with use of recent miniaturization processes. Therefore, it is impossible with FPGAs and ASICs to realize the desired OSR. Accordingly, the above desired OSR needs to be realized with digital RF circuits that operate at a clock rate of some GHz like the example of Non-Patent Document 2.

Even if an upsampling process and a high-order filtering process that satisfy the aforementioned desired OSR can be realized in a digital RF circuit operating at a clock rate of some GHz, the following problems, still remain.

In the related art shown in FIG. 1, phase-modulated signal P(t) of carrier wave frequency fc, as the output signal from phase modulator 1a, is an analog continuous signal. Further, the carrier wave (frequency fc) from oscillator 9 and the sampling clock (frequency fs) for delta-sigma modulation from oscillator 8 are asynchronous. Even if a common reference generator is used for both signals, when there is duty difference resulting from the difference between the signals (sinusoidal signal and rectangular clock signal) or when the two signals take different paths, it is impossible to make the temporal relationship between the two signals constant. For these reasons, the two signals become asynchronous.

As described above, in multiplier 2a, phase modulated signal P(t) is on-off modulated by amplitude pulse modulated signal A'(t) as the output signal from delta-sigma modulator 3a. In this on-off modulating operation, when the carrier wave (frequency fc) in phase modulated signal P(t) and the sampling clock (frequency fs) for delta-sigma modulation are asynchronous, in order to alleviate its influence, it is necessary to adapt fc to be sufficiently higher than fs.

Also in Non-Patent Document 1 related to Patent Document 1, the condition in which fc should be sufficiently higher than fs (fs<<fc) is specified. However, actually, fs needs to be a frequency ranging from about 600 MHz to about 2 GHz, as stated above. In contrast, the radio frequency fc in UTRA (Universal Terrestrial Radio Access) and E-UTRA (Evolved Universal Terrestrial Radio Access) ranges from 700 MHz to 3.5 GHz. Accordingly, fc forms an asynchronous clock having a frequency approximately equal to or markedly close to fs. In this case, the problem occurs in which the signal obtained by on-off modulation of phase modulated signal P(t) with amplitude pulse modulated signal A'(t) cannot form a desired pulse waveform, due to timing deviation of signal transitions.

Here, as a technique for synchronizing the carrier wave (frequency fc) in phase modulated signal P(t) with the sampling clock for delta-sigma modulation (frequency fs), phase modulator 1a can be formed of a digital circuit based on a synchronized clock system, instead of an analog circuit. In this case, I'(t) and Q'(t) are upsampled to 4× sampling rate of the carrier wave frequency fc while I'(t) is repeatedly multiplied by 1, 0, −1, 0 . . . and Q'(t) is repeated multiplied by 0, 1, 0, −1 . . . , to thereby realize digital orthogonal modulation. However, fc ranges from 700 MHz to 3.5 GHz as stated above. Accordingly, phase modulator 1a needs to be operated at four times the rate of fc, i.e., 2.8 GHz to 14 GHz. This entails a high level of difficulty and poses many problems.

Patent Document 3 proposes, as a technique for synchronizing the carrier wave in the phase modulation signal with the sampling clock for delta-sigma modulation, the technique illustrated in FIG. 11 of Patent Document 3. Specifically, in this technique, the phase modulated signal that has been orthogonally modulated with the carrier wave by an orthogonal modulator (IQ modulator) is transformed into a pulse phase signal by a pulse phase signal generator, and this pulse phase signal is used as the clock for the delta-sigma modulator. However, in this technique, the sampling clock for delta-sigma modulation has been synchronized with the carrier wave, but cannot have been synchronized with the actual data of the amplitude component signal of the baseband signal input to the delta-sigma modulator. Accordingly, the delta-sigma modulator will perform data transmission between asynchronous clocks. As a result, a problem occurs in which the delta-sigma modulator samples invalid data during the period in which the amplitude component signal, as the input signal, is transitioning.

Here, in the examples of FIGS. 3, 14 and 36 of Patent Document 3, since the amplitude component signal is not a digital baseband signal but is generated from the signal that has been orthogonally modulated by the carrier wave through the orthogonal modulator (IQ modulator), the above problem will not occur. However, since the input signal to the delta-sigma modulator is an analog signal, a 1 bit D/A converter that operates based on carrier wave frequency fc is needed in computing the difference between the output signal from, and input signal to, the delta-sigma modulator in the delta-sigma modulation process, which is difficult to achieve.

RELATED ART DOCUMENTS

Patent Documents

Patent Document 1: JP2011-135200A
Patent Document 2: JP3878029
Patent Document 3: WO2011/078120

Non-Patent Documents

Non-Patent Document 1: E. Umali, Y. Toyama and Y. Yamao, "power Spectral Analysis of the Envelope Pulse-Width Modulation (EPWM) Transmitter for High Efficiency Amplification of OFDM Signals", Prc. IEEE VTC Spring, May 2008.
Non-Patent Document 2: A. Frapee, B. Stefanelli, A. Flament, A. Kaiser and A. Cathelin, "A digital ΔΣ RF signal generator for mobile communication transmitters in 90 nm CMOS", in IEEE RF IC Symp., June 2008.

SUMMARY OF THE INVENTION

Problems to be Solved by the Invention

As described above, in the related art, there is a chance that the quantization noise can be reduced if a digital RF circuit that operates at a clock rate of some GHz is used.

However, even though quantization noise can be reduced, there is still a problem in which it is impossible to synchronize the sampling clock for delta-sigma modulation not only with the carrier wave but also with the actual data of the amplitude component signal that is input to the delta-sigma modulator.

It is therefore an object of the present invention to solve the above problems and provide a transmission circuit that can reduce quantization noise and that can synchronize the sampling clock for delta-sigma modulation not only with the carrier wave but also with the actual data of the amplitude component signal that is input to a delta-sigma modulator.

Means for Solving the Problems

A transmission circuit of the present invention includes a delta-sigma modulator that performs delta-sigma modulation on an amplitude component signal of a baseband signal to output an amplitude pulse-modulated signal, an orthogonal modulator that performs orthogonal modulation on the angular component signal of the baseband signal with a carrier wave to output a phase-modulated signal and a first multiplier that multiplies the amplitude pulse-modulated signal and the phase-modulate signal to output the result of multiplication to a power amplifier, and further comprises:
  a comparator that converts the phase-modulated signal into a pulse signal; and
  an asynchronous clock transfer unit and an interpolating circuit, disposed between a circuit operating based on the baseband clock and the delta-sigma modulator.
The delta-sigma modulator operates using the pulse signal into which the comparator converts the phase-modulated signal, as a sampling clock,
  the asynchronous clock transfer unit converts the amplitude component signal synchronized with the baseband clock, into an amplitude component signal synchronized with an N-frequency divided clock obtained by dividing the frequency of the sampling clock by N (N is a natural number equal to or greater than 2) and outputs the resultant signal to the interpolating circuit, and,
  the interpolating circuit interpolates the output signal from the asynchronous clock transfer unit so that the amount of change of one sample in the N-frequency divided clock becomes equal to the amount of change of one sample in the sampling clock and outputs the resultant signal to the delta-sigma modulator.

Effect of the Invention

According to the transmission circuit of the present invention, it is possible to obtain the effect of reducing quantization noise and the effect of synchronizing the sampling clock for delta-sigma modulation not only with the carrier wave but also with the actual data of the amplitude component signal that is input to a delta-sigma modulator.

BRIEF DESCRIPTION OF THE DRAWINGS

FIG. 13-a A diagram showing a signal waveform representing a signal obtained when multiplier 17 multiplies amplitude component signal A"(t) rate-converted by sample and hold circuit 21 shown in FIG. 11 and phase modulated signal P(t), on the orthogonal coordinate plane.

FIG. 13-b A diagram showing a signal waveform representing a signal obtained when multiplier 17 multiplies amplitude component signal A"(t) rate-converted by interpolating circuit 22 shown in FIG. 12 and phase modulated signal P(t), on the orthogonal coordinate plane.

MODE FOR CARRYING OUT THE INVENTION

Now, modes for carrying out the present invention will be described with reference to the drawings.

(1) Description of the Configuration of the Present Embodiment

Figure 3:
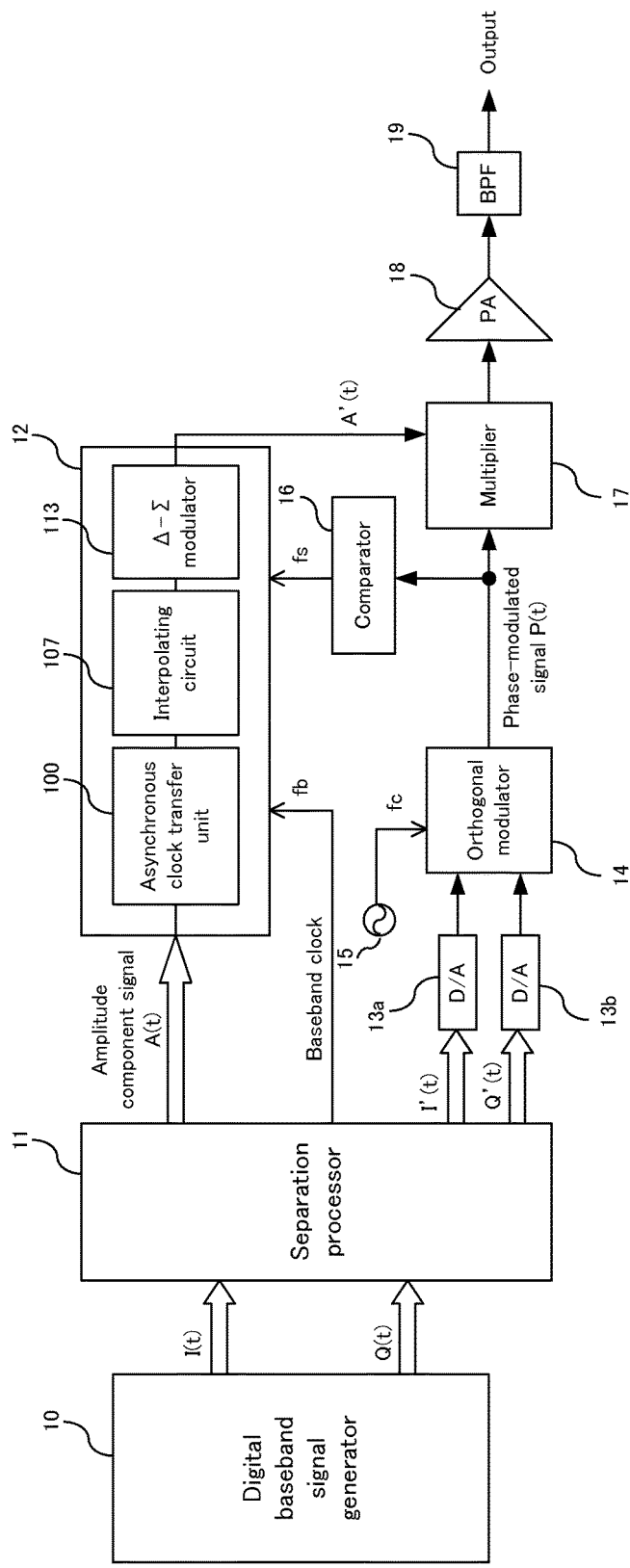
FIG. 3 A block diagram showing a configurational example of a transmission circuit of one exemplary embodiment of the present invention.

FIG. 3 shows one configuration example of a transmission circuit of one embodiment of the present invention.

As shown in FIG. 3, the transmission circuit of the present exemplary embodiment includes digital baseband signal generator 10, separation processor 11, sampling rate-convertible delta-sigma modulating circuit 12, digital-to-analog converters 13a, 13b, orthogonal modulator 14, oscillator 15, comparator 16, multiplier 17, switching amplifier 18 and band pass filter (BPF) 19. Sampling rate-convertible delta-sigma modulating circuit 12 includes asynchronous clock transfer unit 100, interpolating circuit 107 and delta-sigma modulator 113. Here, switching amplifier 18 is denoted by 'PA' in FIG. 3. Further, in FIG. 3 multiplier 17 corresponds to a first multiplier while digital baseband signal generator 10 and separation processor 11 correspond to the circuit that operates based on the baseband clock (frequency fb).

Digital baseband signal generator 10 generates and outputs orthogonal baseband signals I(t) and Q(t).

Separation processor 11 separates the orthogonal baseband signals I(t) and Q(t) output from digital baseband signal generator 10 into amplitude component signal A(t) expressed by the above Ex. 2 and angular component signals I'(t) and Q'(t) expressed by the above Exs. 6 and 7 and outputs the resultant signals. Amplitude component signal A(t) is supplied to sampling rate-convertible delta-sigma modulating circuit 12 while angular component signals I'(t) and Q'(t) are supplied to digital-to-analog converters 13a, 13b.

Sampling rate-convertible delta-sigma modulating circuit 12 subjects amplitude component signal A(t) output from separation processor 11 to delta-sigma modulation to convert the signal into amplitude pulse modulated signal A'(t) and outputs the converted amplitude pulse modulated signal A'(t). The internal circuit configuration and operation of sampling rate-convertible delta-sigma modulating circuit 12 will be described later.

Digital-to-analog converters 13a, 13b are each formed of an unillustrated D/A converter and a low pass filter (LPF: Low Pass Filter). Digital-to-analog converters 13a and 13b convert angular component signals I'(t) and Q'(t) output from separation processor 11 into respective analog signals and output the resultant signals.

Orthogonal modulator 14 subjects the analog angular component signals output from digital-to-analog converters 13a, 13b to orthogonal modulation with the carrier wave (frequency fc) output from oscillator 15 to convert the signals into phase-modulated signal P(t) and outputs phase-modulated signal P(t) thus converted.

Comparator 16, by comparing the voltage of phase-modulated signal P(t) output from orthogonal modulator 14 with a predetermined threshold, determines whether the signal is "0" or "1", and converts phase-modulated signal P(t) into a pulse signal with a 50% duty cycle based on the determined result and outputs the resultant signal.

Figure 1:
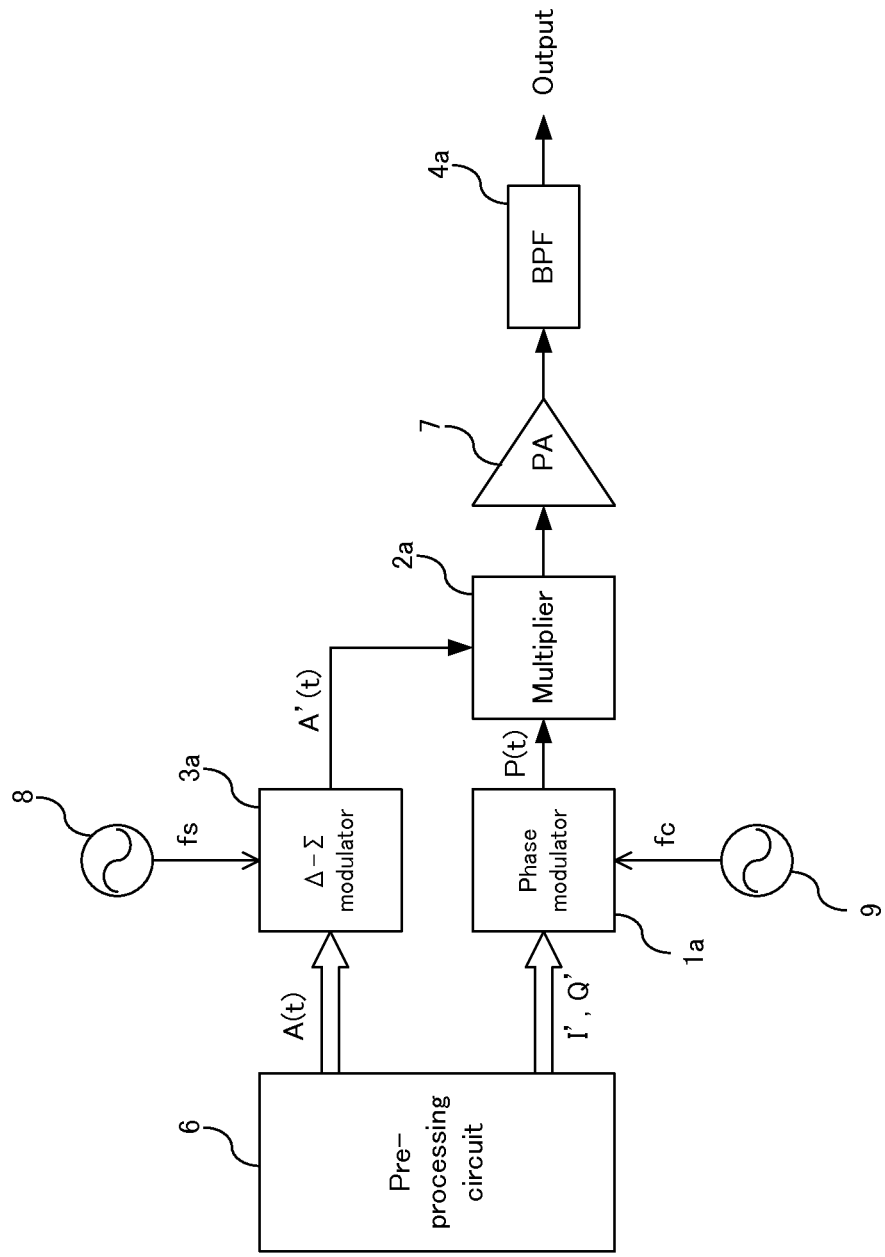
FIG. 1 A block diagram showing a configuration of a transmission circuit of the related art according to Patent Document 1.
Figure 2:
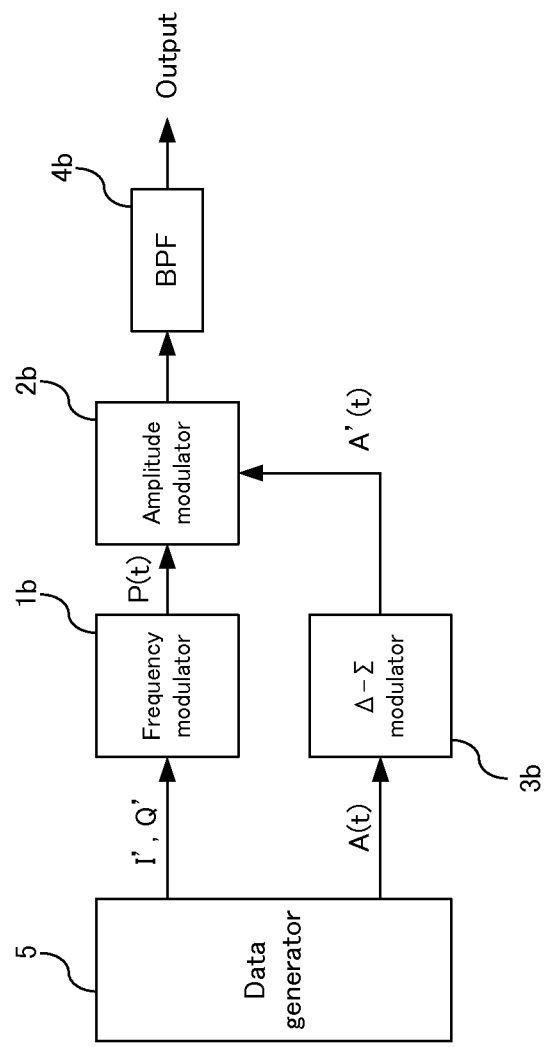
FIG. 2 A block diagram showing a configuration of a transmission circuit of the related art according to Patent Document 2.

Supplied from comparator 16 to sampling rate-convertible delta-sigma modulating circuit 12 is the pulse signal converted from phase-modulated signal P(t). This pulse signal is used as the sampling clock for delta-sigma modulation (frequency fs). Herein, since the sampling clock for delta-sigma modulation is not the carrier wave itself, the frequency of the sampling clock for delta-sigma modulation is denoted by fs in order to distinguish it from the carrier wave and in order to show the relationship with FIG. 1 in the related art. However, the sampling clock for delta-sigma modulation is a clock synchronized with phase-modulated signal P(t) having the same frequency fc of the carrier wave.

Further, the baseband clock (frequency fb) from separation processor 11 is also input to sampling rate-convertible delta-sigma modulating circuit 12. Therefore, sampling rate-convertible delta-sigma modulating circuit 12 converts amplitude component signal A(t) as the input data synchronized with the baseband clock (frequency fb) into data synchronized with the sampling clock for delta-sigma modulation (frequency fs).

Multiplier 17 multiplies amplitude pulse modulated signal A'(t) output from sampling rate-convertible delta-sigma modulating circuit 12 with phase-modulated signal P(t) output from orthogonal modulator 14. As a result, phase-modulated signal P(t) is on-off modulated by amplitude pulse modulated signal A'(t) involving amplitude information. The output signal from multiplier 17 is supplied to switching amplifier 18, represented by, for example a class-D amplifier or class-E amplifier.

Switching amplifier 18 amplifies the output signal from multiplier 17 and outputs the resultant signal. The output signal from switching amplifier 18 includes quantization noise that has been shifted to the outside of the transmission signal band by the noise-shaping characteristics of the delta-sigma modulator 113.

Band pass filter 19 attenuates the quantization noise existing in the output signal from switching amplifier 18. This makes it possible to achieve desired radio characteristics.

Next, the configuration and operation of sampling rate-convertible delta-sigma modulating circuit 12 will be described in detail using mathematical expressions and drawings.

Figure 4:
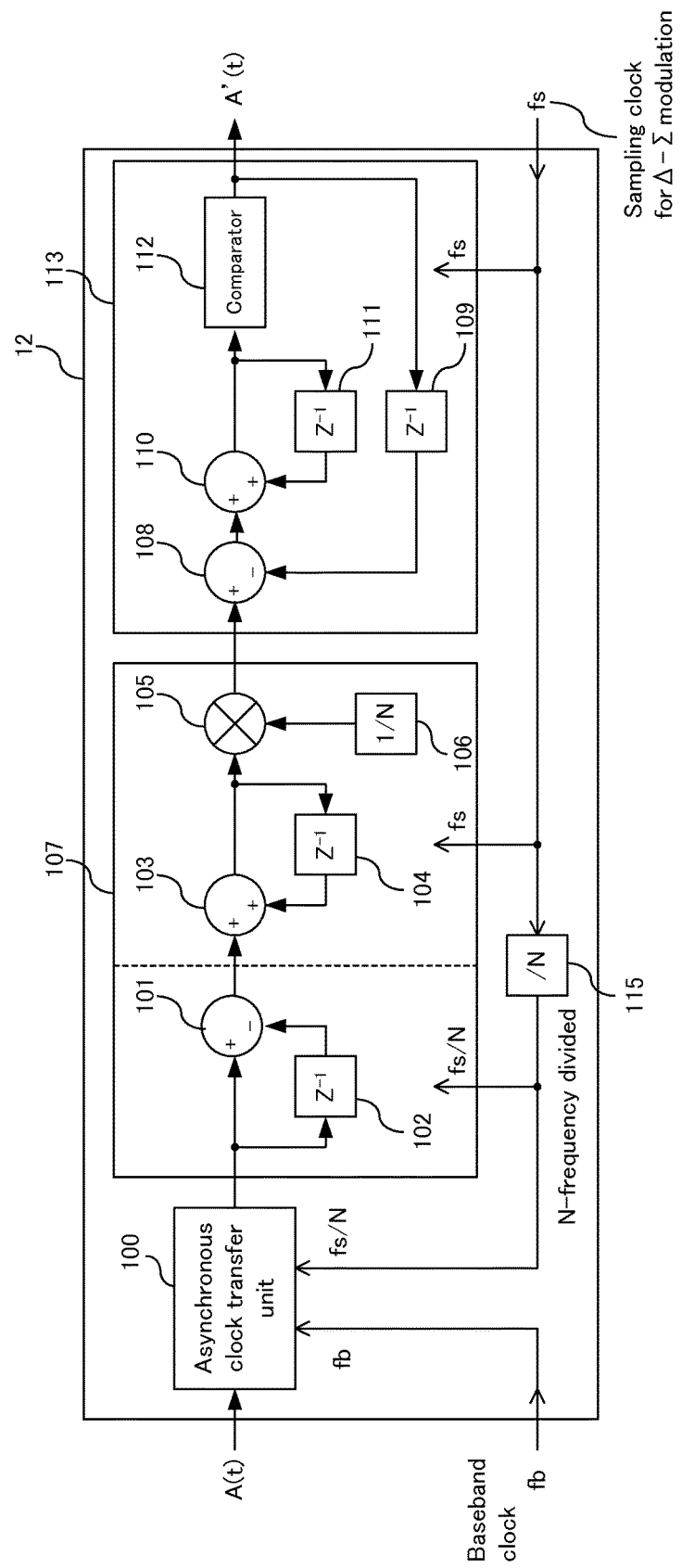
FIG. 4 A block diagram showing a configurational example of a sampling rate-convertible delta-sigma modulating circuit 12 shown in FIG. 3.

FIG. 4 shows one configurational example of sampling rate-convertible delta-sigma modulating circuit 12.

As shown in FIG. 4, sampling rate-convertible delta-sigma modulating circuit 12 includes frequency divider 115, other than the above-described, asynchronous clock transfer unit 100, interpolating circuit 107 and delta-sigma modulator 113.

To begin with, asynchronous clock transfer unit 100 will be described.

Asynchronous clock transfer unit 100 performs a clock transfer process between asynchronous clocks. Clock transfer is to convert data (input data) synchronized with a certain clock (input clock) into data (output data) synchronized with a clock (output clock) different in frequency from the input clock. As a technology for transferring data between different clocks, there is a technique of performing data transfer while providing notification of valid data capturing timing to a flip-flop by exchanging handshake signals, i.e., the request signal (REQ) and the acknowledgement signal(ACK) (Patent Document 4: JP4394620, for example).

The reason why asynchronous clock transfer unit 100 is required is, as described in aforementioned Patent Document 3, in order to solve the problem in which, in the delta-sigma modulator, invalid data is sampled from the amplitude component signal as the input signal during a transition period.

Figure 5:
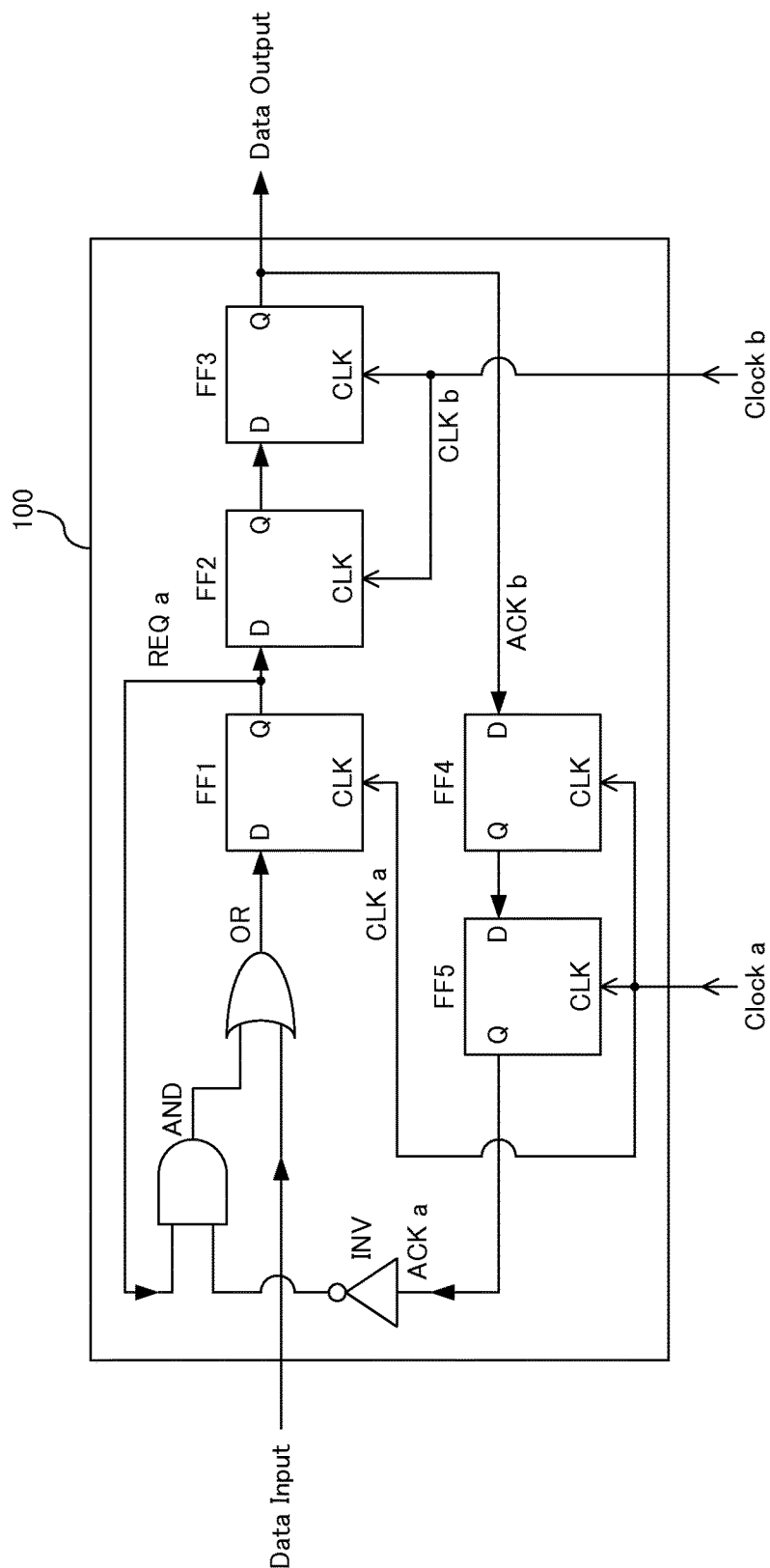
FIG. 5 A block diagram showing one configurational example of asynchronous clock transfer unit 100 shown in FIG. 4.

As one configurational example of asynchronous clock transfer unit 100, a circuit configuration shown in FIG. 5 is proposed. Here, the circuit in FIG. 5 is configured to treat the data to be transferred itself as a request signal in Patent Document 4, with the goal of simplifying the circuit configuration.

As shown in FIG. 5, the circuit proposed as asynchronous clock transfer unit 100 includes a first logical block (FF1: flip-flop 1), a second logical block (FF2: flip-flop 2, FF3: flip-flop 3), a third logical block (FF4: flip-flop 4, FF5: flip-flop 5), and a fourth logical block (INV: inverter circuit, AND: AND circuit, OR: OR circuit).

The first logical block (FF1: flip-flop 1) outputs data input-side request signal REQ a synchronized with input clock a.

The second logical block (FF2: flip-flop 2, FF3: flip-flop 3), transfers request signal REQ a synchronized with input clock a onto data synchronized with output clock b and outputs the data as a data output signal, and at the same time outputs the data output signal as data output-side acknowledgement signal ACK b synchronized with output clock b.

The third logical block (FF4: flip-flop 4, FF5: flip-flop 5), transfers acknowledgment signal ACK b synchronized with output clock b onto data input-side acknowledge signal ACK synchronized with input clock a and outputs the resultant signal.

The fourth logical block (INV: inverter circuit, AND: AND circuit, OR: OR circuit) performs a handshake process between the aforementioned request signal REQ a synchronized with input clock a and the aforementioned returned acknowledgement signal ACK a on which the data synchronized with input clock a has been transferred, to suspend the change of the data input signal to be reflected on the change of the next request signal REQ a until transmission to the data output side is completed.

Figure 6:
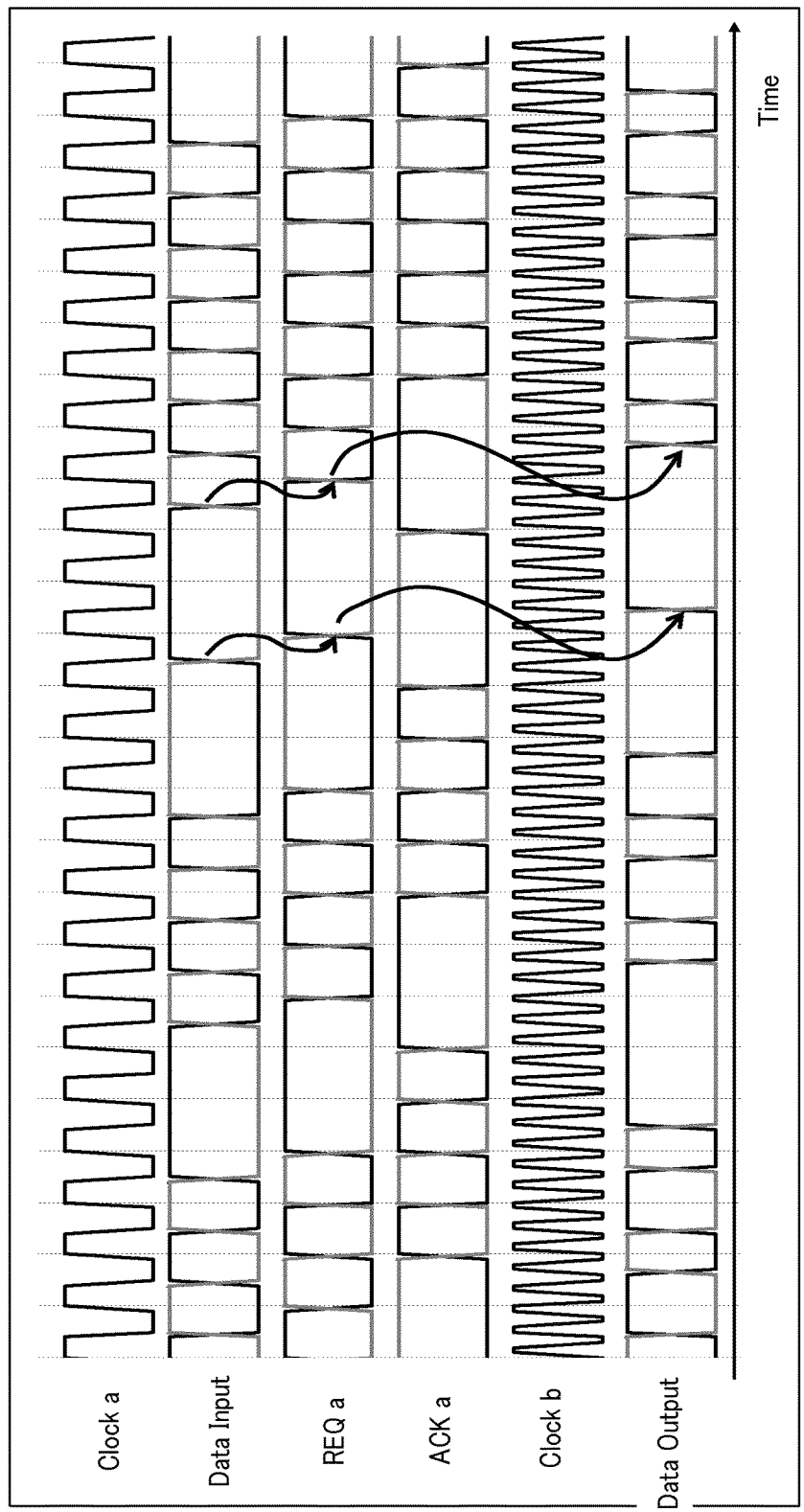
FIG. 6 A timing chart diagram showing a clock transfer process between asynchronous clocks in asynchronous clock transfer unit 100 shown in FIG. 5.

FIG. 6 is a timing chart of a clock transfer process between the asynchronous clocks in the circuit shown in FIG. 5.

As shown in FIG. 6, it is understood that, in the circuit shown in FIG. 5, between the asynchronous clocks having different frequencies, namely, input clock a and output clock b, the data input signal synchronized with input clock a is converted into the data output signal synchronized with output clock b. Here, since the technique used for handshaking signals is in the public domain, detailed description is omitted.

In asynchronous clock transfer unit 100, the input clock is the baseband clock (frequency fb) shown in FIG. 4. The output clock is an N-frequency divided clock having a frequency of fs/N, which is obtained by dividing the frequency of the sampling clock for delta-sigma modulation (frequency fs) shown in FIG. 4 by N (N is a natural number equal to or greater than 2) by divider 115.

By the operation of asynchronous clock transfer unit 100 illustrated as above, amplitude component signal A(t), as the input data synchronized with the baseband clock (frequency fb), is converted into data synchronized with the N-frequency divided clock (frequency fs/N) that is obtained by dividing the frequency of the sampling clock for delta-sigma modulation (frequency fs) by N, then the resultant is output to interpolating circuit 107 at the downstream stage.

Next, interpolating circuit 107 will be described.

Herein, in order to realize interpolating circuit 107 with a small-scale circuit, a method as follows is proposed to perform an interpolating process. First, it is assumed that interpolation is performed under the condition in which output clock frequency fo, after interpolation, is N times the frequency of input clock frequency fi. Under this condition, interpolation is performed so that the amount of change by one sample in input signal x(t) for input clock signal frequency fi (period Ti) becomes equal to that in output signal y(t) for output clock frequency fo (period To) after interpolation.

On the basis of the sampling process in output clock frequency fo (period To) after interpolation, the above condition can be represented by the following expression 11.

[Math 11]

$$\frac{y(t) - y(t-1)}{T_o} = \frac{x(t) - x(t-N)}{N \cdot T_o}; N = \frac{f_o}{f_i} = \frac{T_i}{T_o} \quad \text{(Ex. 11)}$$

The above Ex. 11 is Z-transformed, the following expression 12 is obtained.

[Math 12]

$$Y(z) \cdot (1 - Z^{-1}) = X(z) \cdot \frac{1 - Z^{-N}}{N} \quad \text{(Ex. 12)}$$

Accordingly, the transfer function of the proposed interpolating process is represented as the following expression 13.

[Math 13]

$$\frac{Y(z)}{X(z)} = \left(\frac{1}{N}\right) \cdot \frac{1 - Z^{-N}}{1 - Z^{-1}} \quad \text{(Ex. 13)}$$

Herein, $Z^{-N}$, the numerator on the right side of Ex. 13 is a delay of N clock periods in the sampling process based on output clock frequency fo (period To) after interpolation. However, in the sampling process based on input clock frequency fi, the delay remains a delay of one sample, or a delay of one clock period of input clock frequency fi. Accordingly, actual interpolating circuit 107 can be realized with a small-scale and simple configuration as shown in FIG. 4.

Specifically, interpolating circuit 107 shown in FIG. 4 includes a first circuit block composed of adder 101 and one-sample delay element 102, a second circuit block composed of adder 103 and one-sample delay element 104, multiplier coefficient retainer 106 and multiplier 105. Here, in FIG. 4, adders 101 and 103 correspond to the first and second adders, respectively. One-sample delay elements 102 and 104 correspond to the first and second one-sample delay elements, respectively. Multiplier 105 corresponds to the second multiplier.

The first circuit block is a circuit block to implement a transfer function of the following expression 14, and operates with N-frequency divided clock (frequency fs/N) obtained by dividing the frequency of the sampling clock for delta-sigma modulation (frequency fs) by N.

[Math 14]

$$1 - Z^{-1} \quad \text{(Ex. 14)}$$

Specifically, in the first circuit block, one-sample delay element 102 delays the output signal from asynchronous clock transfer unit 100 by one sample period and outputs the signal. Adder 101 subtracts the output signal from one-sample delay element 102, from the output signal from asynchronous clock transfer unit 100, and outputs the result of subtraction.

The second circuit block is a circuit block to implement a transfer function of the following expression 15, and operates based on the sampling clock for delta-sigma modulation (frequency fs).

[Math 15]

$$\frac{1}{1 - Z^{-1}} \quad \text{(Ex. 15)}$$

Specifically, in the second circuit block, one-sample delay element 104 delays the output signal from adder 103 by one sample period and outputs the signal. Adder 103 adds the output signal from adder 101 in the first circuit block and the output signal from one-sample delay element 104 and outputs the result of addition.

Multiplier coefficient retainer 106 retains a multiplier coefficient (=1/N).

Multiplier 105 multiplies the output signal from adder 103 in the second circuit block with a multiplier coefficient (=1/N) and outputs the result of multiplication to delta-sigma modulator 113. Here, multiplier 105 operates based on the sampling clock for delta-sigma modulation (frequency fs).

As stated above, the first circuit block is operated based on the N-frequency divided clock (frequency fs/N). Therefore, one-sample delay element 102 for the clock having a frequency of fs/N can be realized by a flip-flop.

As stated above, the second circuit block is operated based on the sampling clock for delta-sigma modulation (frequency fs). Therefore, one-sample delay element 104 for the clock with frequency fs can be realized by a flip-flop.

Finally, delta-sigma modulator 113 will be described.

The example of FIG. 4 shows a configuration in which delta-sigma modulator 113 is formed of a first order delta-sigma modulator. The frequency of the sampling clock for delta-sigma modulation is fs.

Delta-sigma modulator 113 shown in FIG. 4 includes a third circuit block configured of adder 110 and one-sample delay element 111, a fourth circuit block configured of adder 108 and one-sample delay element 109 and comparator 112.

The third circuit block has the same configuration as that of the second circuit block in interpolating circuit 107 described above and realizes the same transfer function as the above Ex. 15.

Comparator 112, by comparing the voltage of the output signal from adder 110 in the third circuit block with a predetermined threshold, determines whether the signal is "0" or "1", and quantizes the output signal from adder 110 to one-bit form based on the result of determination and produces a pulse signal.

Here, when Z-conversion of the quantization noise arising in the quantization process in comparator 112 is represented as Q(z) while Z-conversions of the input signal and output signal of delta-sigma modulator 113 are represented as Vin (z) and Vout(z), respectively, the input/output relationship of delta-sigma modulator 113 is represented by the following expression 16.

[Math 16]

$$Vout(z) = \{Vin(z) - Z^{-1} \cdot Vout(z)\} \cdot \frac{1}{1-Z^{-1}} + Q(z) \quad \text{(Ex. 16)}$$

The above Ex. 16 can be rearranged into the following expression 17.

[Math 17]

$$Vout(z) = Vin(z) + (1-Z^{-1}) \cdot Q(z) \quad \text{(Ex. 17)}$$

The above Ex. 17 is an expression representing the noise-shaping characteristics of a first order delta-sigma modulator. That is, the above Ex. 17 shows that the noise on the low-frequency side (in the transmission signal band, for example) of quantization noise Q(z) that is uniformly distributed over the frequency axis can be shifted to the high-frequency side (to the outside of the transmission signal band) by a filter having characteristics represented by $(1-Z^{-1})$.

In the fourth circuit block, one-sample delay element 109 delays the output signal from comparator 112 by one sample period and outputs the signal. Adder 108 subtracts the output signal from one-sample delay element 109, from the output signal from interpolating circuit 107 and outputs the result of subtraction to adder 110 in the third circuit block.

(2) Description of the Operation of the Present Exemplary Embodiment

Sampling rate-convertible delta-sigma modulating circuit 12 includes the configuration described above.

Accordingly, amplitude component signal A(t) as the input data synchronized with the baseband clock (frequency fb) is transferred in asynchronous clock transfer unit 100, onto data synchronized with the N-frequency divided clock (frequency fs/N) obtained by dividing the frequency of the sampling clock for delta-sigma modulation (frequency fs) by N.

Next, the amplitude component signal having been transferred on the N-frequency divided clock (frequency fs/N) is subjected to N-times interpolation in interpolating circuit 107 so that the amount of change by one sample in the N-frequency divided clock (frequency fs/N) obtained by dividing the frequency of the sampling clock for delta-sigma modulation (frequency fs) by N becomes equal to the amount of change by one sample in the sampling clock for delta-sigma modulation (frequency fs).

Thereafter, the amplitude component signal thus interpolated is converted by delta-sigma modulator 113 that operates based on the sampling clock for delta-sigma modulation (frequency fs), into amplitude pulse-modulate signal A'(t), which is then output.

Herein, in order to make the oversampling ratio large and in order to make interpolating circuit 107 small-sized with FPGAs and/or ASICs, rate allocation that enables frequency fb to be as high as possible is implemented in digital baseband signal generator 10.

For example, it is assumed that the input signal to digital baseband signal generator 10 is a LTE (Long Term Evolution) OFDMA signal in 3GPP (3$^{rd}$ Generation Partnership Project) E-UTRA (Evolved Universal Terrestrial Radio Access). When the channel bandwidth of the LTE OFDMA signal is 5 MHz, the original sampling rate is 7.68 MHz. When the channel bandwidth is 20 MHz, the original sampling rate is 30.72 MHz. For example, in the latter case, i.e., in the case of 20 MHz, digital baseband signal generator 10 upsamples fb by 4 times or 8 times so as to make allocation of interpolation ratio in interpolating circuit 107 smaller as compared with the original sampling rate or 30.72 MHz. This makes it possible to obtain a sufficient interpolation effect even with small-scale interpolating circuit 107 proposed by the present invention. This effect of interpolation will be described in section (3), which contains the description of the effect of the present exemplary embodiment.

The sampling clock for delta-sigma modulation (frequency fs) is a clock that is formed by converting phase-modulated signal P(t) as the output signal from orthogonal modulator 14 into a pulse signal by comparator 16 as stated above, and that is synchronized with phase-modulated signal P(t) having the same frequency fc as that of the carrier wave.

Further, amplitude component signal A(t) is transferred by asynchronous clock transfer unit 100 from the data synchronized with the baseband clock (frequency fb) onto the data synchronized with the N-frequency divided clock (frequency fs/N) that is obtained by dividing the frequency of the sampling clock for delta-sigma modulation (frequency fs) by N.

As a result, in the present exemplary embodiment, it is possible by using a small-scale transmission circuit, as is, to synchronize the sampling clock for delta-sigma modulation (frequency fs) with the carrier wave (frequency fc) and also with the actual data of the amplitude component signal input to delta-sigma modulator 113.

Figure 7:
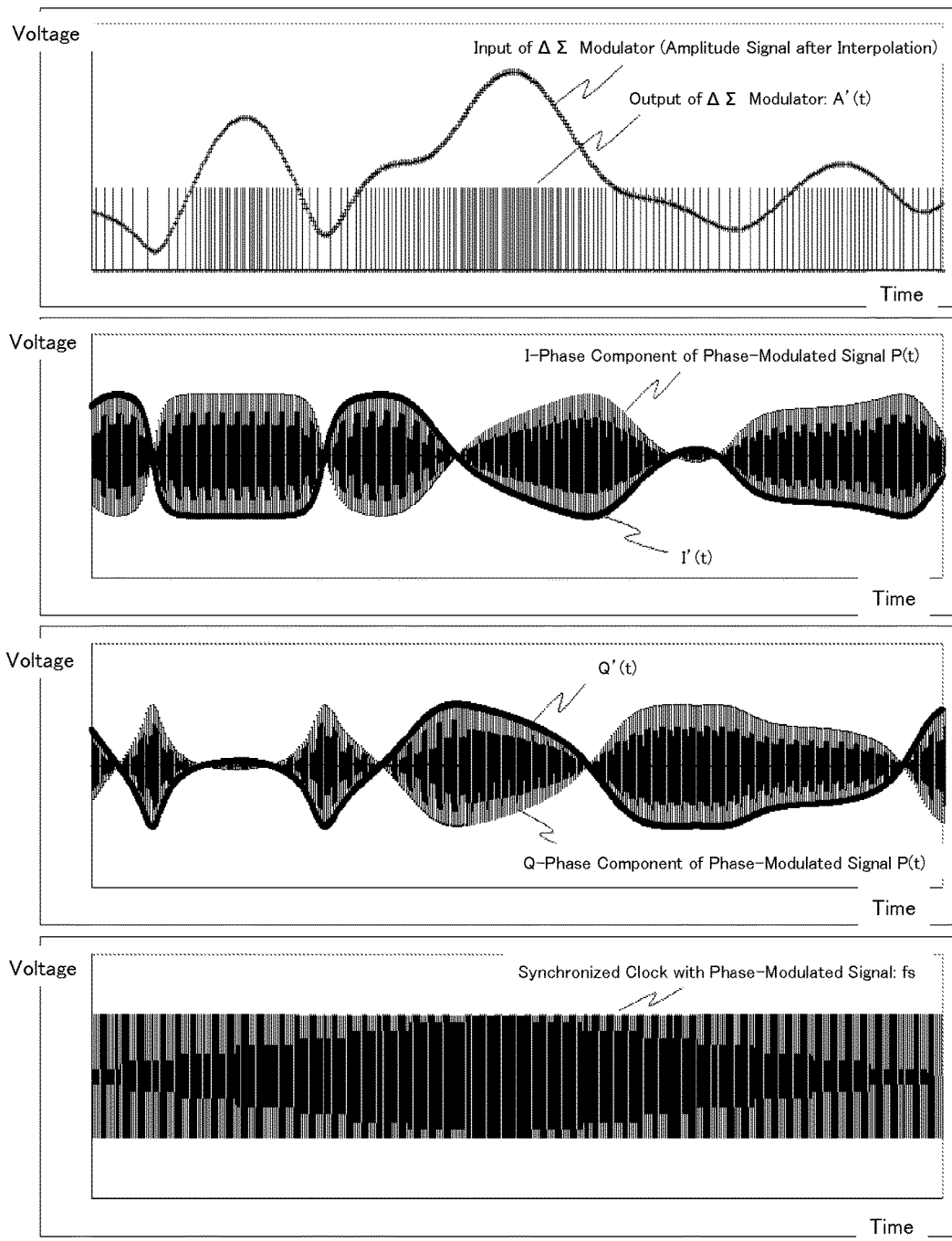
FIG. 7 A diagram showing signal waveforms of signals in different units in the transmission circuit shown in FIG. 3.

FIG. 7 shows a diagram of waveforms of signals in different parts in the transmission circuit shown in FIG. 3.

Specifically, FIG. 7 shows individual signals as follows:

angular component signals I'(t) and Q'(t) after separation at separation processor 11;

input signal to delta-sigma modulator 113 after amplitude component signal A(t) has been subjected to the interpolating process by asynchronous clock transfer unit 100 and interpolating circuit 107 in sampling rate-convertible delta-sigma modulating circuit 12;

I-phase component and Q-phase component of phase-modulated signal P(t) obtained by orthogonally modulating angular component signals I'(t) and Q'(t) with carrier wave frequency fc from oscillator 15 by digital-to-analog converters 13a, 13b and orthogonal modulator 14;

clock (clock synchronized with phase-modulated signals) obtained by converting phase-modulated signal P(t) into a pulse signal by comparator 16; and, amplitude pulse-modulated signal A'(t) converted by sampling rate-convertible delta-sigma modulating circuit 12 that operates using a clock (frequency fs) synchronized with phase-modulated signal P(t) as the sampling clock.

As described above, in the present exemplary embodiment, since the sampling clock for delta-sigma modulation (frequency fs) is synchronized with the carrier wave (frequency fc), it is possible in multiplier 17 to perform on-off modulation on phase-modulated signal P(t) while maintaining synchronization between amplitude pulse-modulated signal A'(t) and phase-modulated signal P(t).

(3) Description of the Effect of the Present Exemplary Embodiment

As has been described, in the transmission circuit of the present exemplary embodiment, phase-modulated signal P(t) is converted into a pulse signal having the same frequency fc as the carrier wave, and this pulse signal is used as the sampling clock for delta-sigma modulation (frequency fs). Further, amplitude component signal A(t) is transferred from the data synchronized with the baseband clock (frequency fb) to the data synchronized with the N-frequency divided clock (frequency fs/N) that is obtained by dividing the frequency of the sampling clock for delta-sigma modulation (frequency fs) by N by asynchronous clock transfer unit 100.

Therefore, it is possible, by using a small-scale transmission circuit, as is, to synchronize the sampling clock for delta-sigma modulation (frequency fs) with the carrier wave (frequency fc) and also with the actual data of the amplitude component signal input to delta-sigma modulator 113.

As a result, it is possible in multiplier 17 to perform on-off modulation on phase-modulated signal P(t) while maintaining synchronization between amplitude pulse-modulated signal A'(t) output from delta-sigma modulator 113 and phase-modulated signal P(t). Further, in delta-sigma modulator 113, it is possible to avoid sampling invalid data during a transition period of the amplitude component signal as the input signal.

In the transmission circuit of the present exemplary embodiment, it is possible to realize reduction of the quantization noise by using a small-scale circuit, as is, thanks to the effect of interpolating circuit 107. This aspect will be described hereinbelow.

Figure 8:
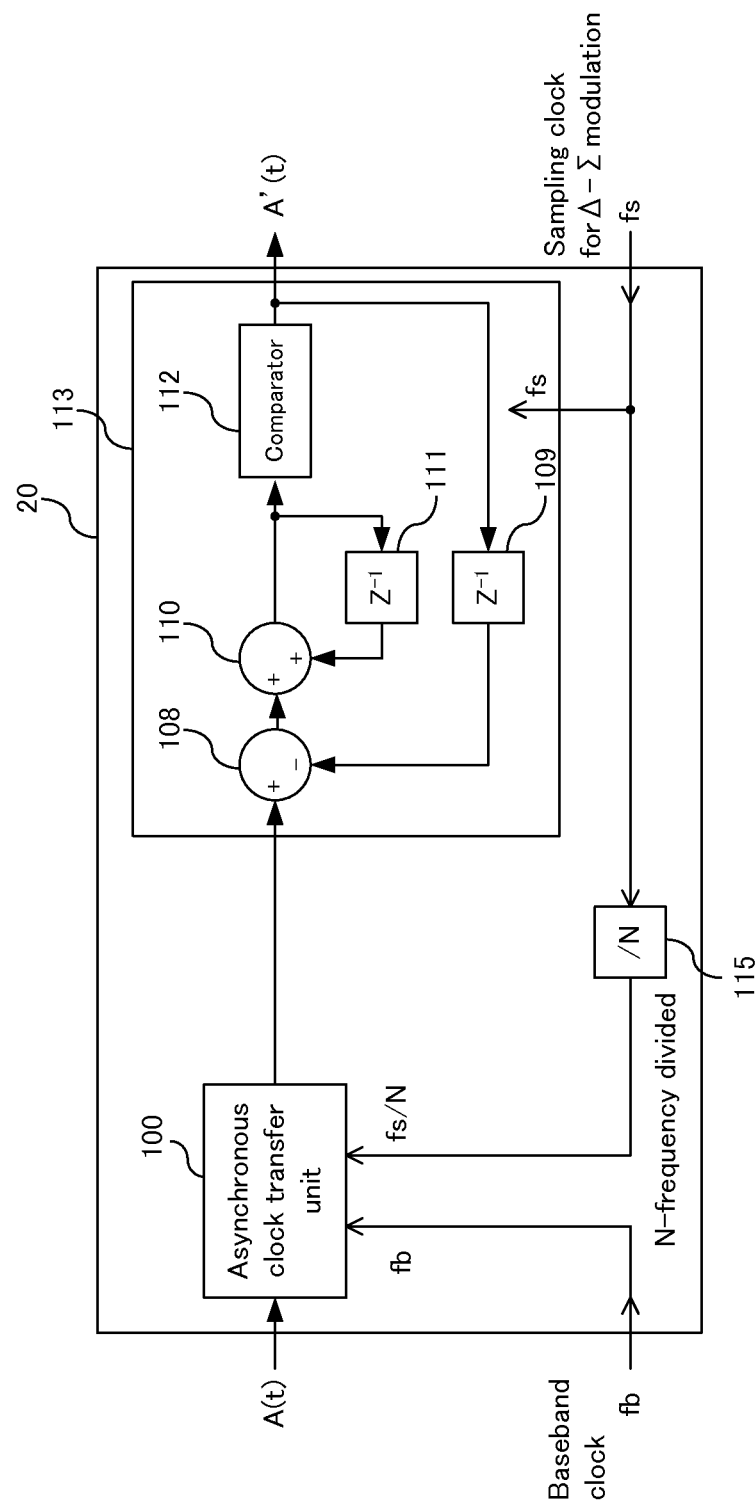
FIG. 8 A block diagram showing a configuration of sampling rate-convertible delta-sigma modulating circuit 20 having the configuration of sampling rate-convertible delta-sigma modulating circuit 12 shown in FIG. 4 from which interpolating circuit 107 is omitted.

In order to show the effect of interpolating circuit 107 according to the present invention, it is assumed that sampling rate-convertible delta-sigma modulating circuit 20 shown in FIG. 8, is the circuit which is equivalent to sampling rate-convertible delta-sigma modulating circuit 12 shown in FIG. 4 except that interpolating circuit 107 alone is removed. Here, since FIG. 8 is the same as FIG. 4 except that there is no interpolating circuit 107 shown in FIG. 4, description of the drawing is omitted.

Now, operation of sampling rate-convertible delta-sigma modulating circuit 12 shown in FIG. 4 will be compared with operation of sampling rate-convertible delta-sigma modulating circuit 20 shown in FIG. 8.

As shown in FIG. 8, sampling rate-convertible delta-sigma modulating circuit 20 does not perform an interpolating process. Therefore, amplitude component signal A(t) synchronized with the baseband clock (frequency fb) is transferred in asynchronous clock transfer unit 100 onto data synchronized with the N-frequency divided clock (frequency fs/N) obtained by dividing the frequency of the sampling clock for delta-sigma modulation (frequency fs) by N. Thereafter, the amplitude component signal having been transferred to the N-frequency divided clock (frequency fs/N) is converted into amplitude pulse-modulate signal A'(t) by delta-sigma modulator 113 that operates based on the sampling clock for delta-sigma modulation (frequency fs) synchronized with phase-modulated signal P(t).

In this case, since delta-sigma modulator 113 operates based on the sampling clock of frequency fs, the input signal sampled and held by the clock of frequency fs/N, is read following the sampling clock of frequency fs. Therefore, amplitude pulse modulated signal A'(t) shows N successive pieces of identical data on the time axis for every sampling of frequency fs. Accordingly, when amplitude pulse-modulated signal A'(t) and phase-modulated signal P(t) are multiplied in multiplier 17 at the downstream stage, amplitude pulse-modulated signal A'(t) changes stepwise every N samples in contrast to the continuous variation (phase rotation) of phase-modulated signal P(t) in sampling of frequency fs.

Figure 9:
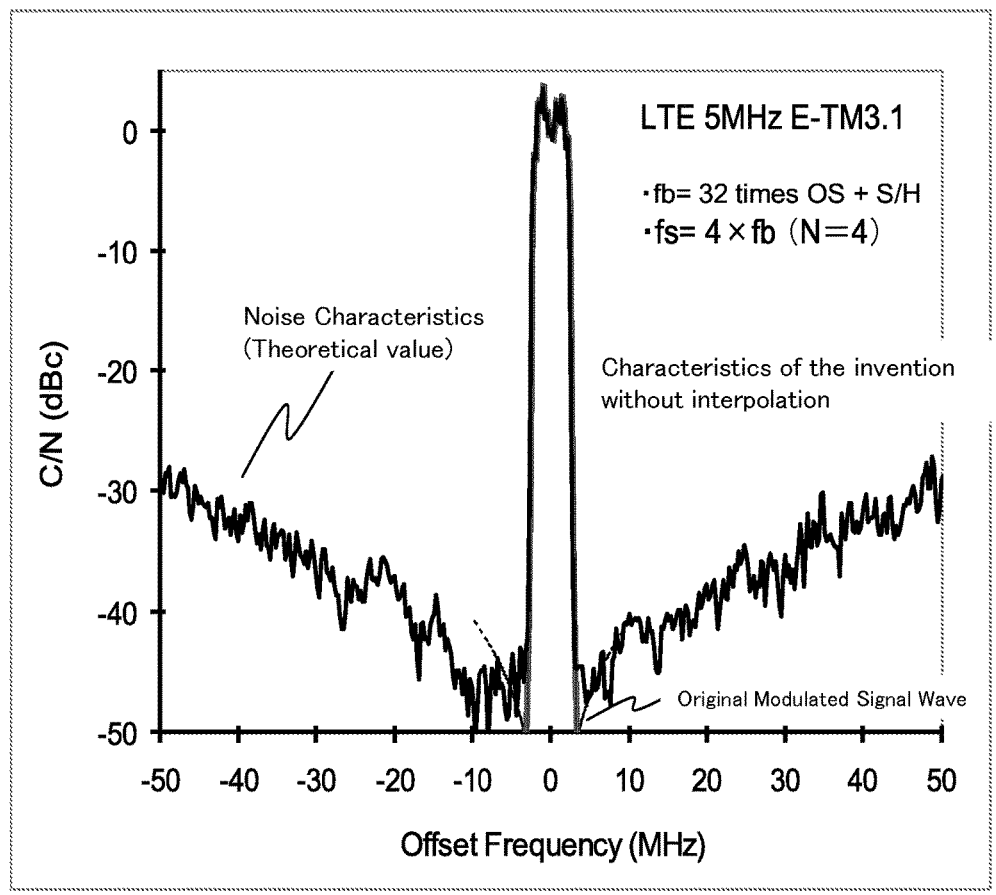
FIG. 9 A diagram showing a spectrum waveform of the output signals from multiplier 17 for LTE 5 MHz OFDMA signals, in the transmission circuit using sampling rate-convertible delta-sigma modulating circuit 20 shown in FIG. 8.

FIG. 9 shows one example of a spectrum waveform (modulation carrier-to-noise ratio=C/N ratio) of the output signal from multiplier 17, in the transmission circuit using sampling rate-convertible delta-sigma modulating circuit 20 shown in FIG. 8, without including interpolating circuit 107 according to the present invention.

In the example of FIG. 9, as the input signal to digital baseband signal generator 10, a LTE OFDMA signal (E-UTRA test model 3.1) having a channel bandwidth of 5 MHz in 3GPP E-UTRA, is used. Digital baseband signal generator 10 upsamples fb up to 245.76 MHz, 32 times the frequency of 7.68 MHz, the original sampling rate of the LTE 5 MHz OFDM signal. Further, frequency fs for the sampling clock for delta-sigma modulation is set at 4 times (N=4) frequency fb. Accordingly, in the example of FIG. 9, the oversampling ratio to the original sampling rate results in 128 (since the actual signal band width is 4.5 MHz, the effective oversampling ratio becomes equivalent to 218).

Sampling rate-convertible delta-sigma modulating circuit 20 shown in FIG. 8 does not perform an interpolating process. Therefore, amplitude component signal A(t) is oversampled at 32 times the original sampling rate. Further, delta-sigma modulator 113 reads the amplitude component signal held for N sample periods, or 4 sample periods in the example of FIG. 9, based on the four times the aforementioned sampling clock. Accordingly, it is impossible to secure an oversampling ratio for actual amplitude variation.

However, as shown in FIG. 9, for the case of a narrow bandwidth signal such as LTE 5 MHz OFDMA signal, the above sample and hold of the input signal to delta-sigma modulator 113 will little affect on the fastest change of the amplitude at 4.5 MHz. This is why noise characteristics comparable to the theoretical value for the oversampling ratio in delta-sigma modulator 113 can be obtained.

Figure 10:
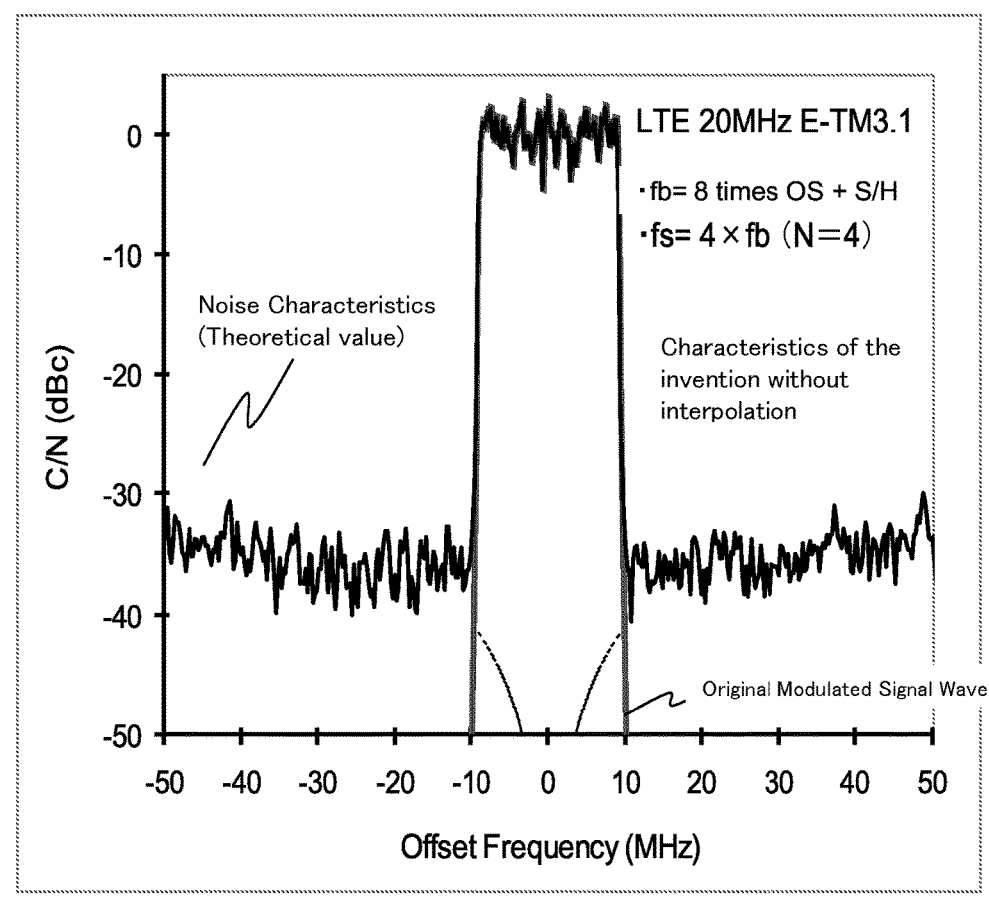
FIG. 10 A diagram showing a spectrum waveform of the output signals from multiplier 17 for LTE 20 MHz OFDMA signals, in the transmission circuit using sampling rate-convertible delta-sigma modulating circuit 20 shown in FIG. 8.

Next, FIG. 10 shows another example of a spectrum waveform (modulation carrier-to-noise ratio=C/N ratio) of the output signal from multiplier 17 in the transmission circuit using sampling rate-convertible delta-sigma modulating circuit 20 shown in FIG. 8, without including interpolating circuit 107 according to the present invention.

In the example of FIG. 10, as the input signal to digital baseband signal generator 10, a LTE OFDMA signal (E-UTRA test model 3.1) having a channel bandwidth of 20 MHz in 3GPP E-UTRA, is used. Digital baseband signal generator 10 upsamples fb up to 245.76 MHz, 8 times the frequency of 30.72 MHz, the original sampling rate of the LTE 20 MHz OFDM signal. Further, frequency fs for the sampling clock for delta-sigma modulation is set at 4 times (N=4) frequency fb, similar to the condition in FIG. 9. Accordingly, in the example of FIG. 10, the oversampling ratio to the original sampling rate results in 32 (since the actual signal bandwidth is 18 MHz, the effective oversampling ratio is equivalent to 54).

In the examples shown in FIGS. 9 and 10, since the power per unit bandwidth is set identical, the total power of the signal is lower by 6 dB in the example of FIG. 9. Accordingly, the carrier-to-noise ratio (C/N ratio), when the modulated carrier in the spectrum waveform is set at 0 dB, is conditioned to degrade by 6 dB in the example of FIG. 9.

In the example of FIG. 10, amplitude component signal A(t) is oversampled at 8 times the original sampling rate. Further, delta-sigma modulator 113 reads the amplitude component signal held for 4 sample periods, following the four times the above sampling clock. Accordingly, it is impossible to secure the oversampling ratio for actual amplitude variation. For the case of the wide bandwidth signal such as LTE 20 MHz OFDMA signal, the above sample and hold in the input signal to delta-sigma modulator 113 will greatly affect on the fastest change of the amplitude at 18 MHz.

This is why the noise characteristics are degraded in the proximity to the modulated carrier, compared to the theoretical noise characteristics for the oversampling ratio in delta-sigma modulator 113, as shown in FIG. 10. In particular, since the noise near the carrier is lower in frequency than the stopband of band pass filter 19 and therefore cannot be eliminated, this raises problem in which it is not possible to realize the desired radio characteristics.

Next, description will be made on generation of noise near the carrier in the wide band signal due to influence of the sample and hold at the input stage of delta-sigma modulator 113.

Figure 11:
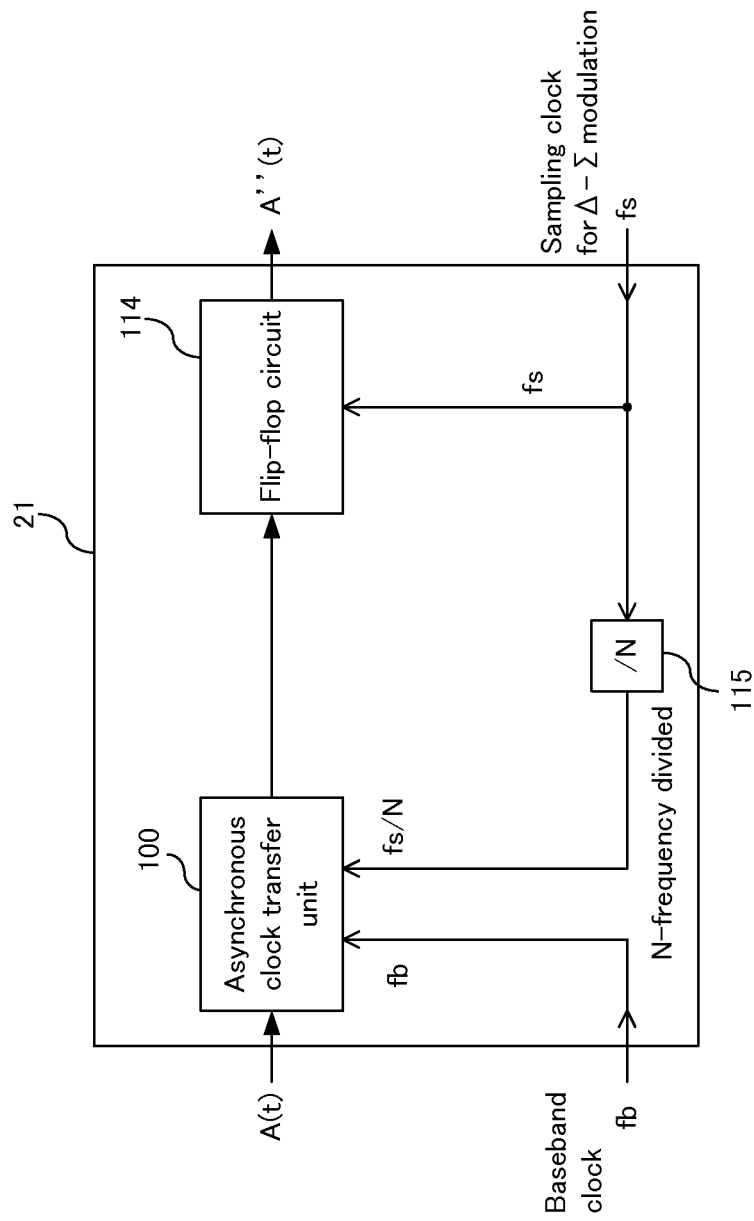
FIG. 11 A block diagram showing a configuration of sample and hold circuit 21 having the configuration of sampling rate-convertible delta-sigma modulating circuit 12 shown in FIG. 4 from which interpolating circuit 107 and delta-sigma modulator 113 are omitted.

Herein, assumed, as shown in FIG. 11, is sample and hold circuit 21, which is the sampling rate-convertible delta-sigma modulating circuit 12 shown in FIG. 4 in which, interpolating circuit 107 according to the present invention and delta-sigma modulator 113 are removed and flip-flop circuit 114 added in order to perform sample and hold. Assumed also is interpolating circuit 22 which is the sampling rate-convertible delta-sigma modulating circuit 12 shown in FIG. 4 in which delta-sigma modulator 113 is removed, as shown in FIG. 12.

Figure 12:
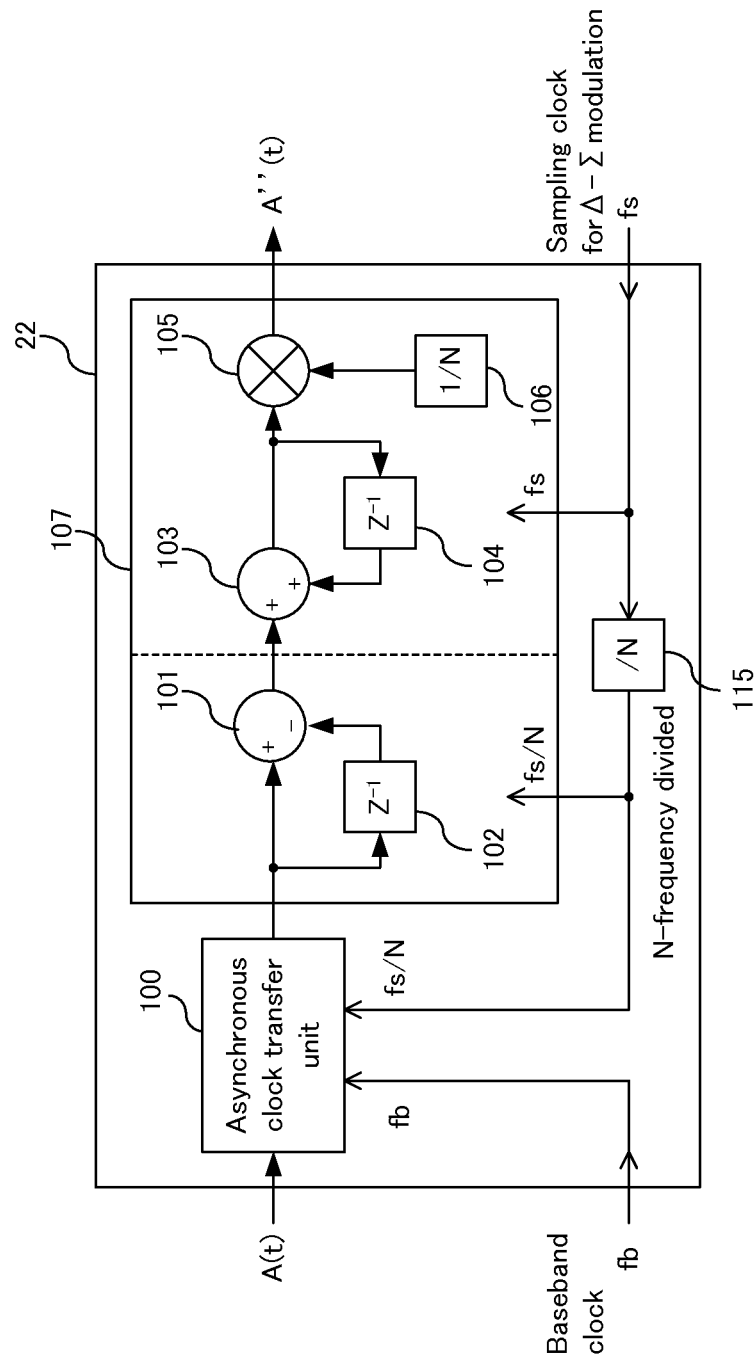
FIG. 12 A block diagram showing a configuration of interpolating circuit 22 having the configuration of sampling rate-convertible delta-sigma modulating circuit 12 shown in FIG. 4 from which delta-sigma modulator 113 is omitted.

Now, the operation of the transmission circuit shown in FIG. 3 in which sampling rate-convertible delta-sigma modulating circuit 12 is replaced by sample and hold circuit 21 shown in FIG. 11 will be compared with the operation of the transmission circuit shown in FIG. 3 in which sampling rate-convertible delta-sigma modulating circuit 12 is replaced by interpolating circuit 22 shown in FIG. 12. Herein, it is assume that the input signal to digital baseband signal generator 10 is the same LTE 20 MHz OFDMA signal as explained with FIG. 10, and the relationship between fb, fs and N is also conditioned the same way as explained with FIG. 10.

The difference between the circuits in FIG. 11 and FIG. 12 is the presence or absence of interpolating circuit 107 according to the present invention. Here, since both the circuits of FIGS. 11 and 12 are structured based on the already illustrated circuit from which partial functions removed, description of the drawings is omitted.

In the transmission circuit shown in FIG. 3 in which sampling rate-convertible delta-sigma modulating circuit 12 is replaced by sample and hold circuit 21 shown in FIG. 11 and the transmission circuit shown in FIG. 3 in which sampling rate-convertible delta-sigma modulating circuit 12 is replaced by interpolating circuit 22 shown in FIG. 12, both lack delta-sigma modulator 113. Accordingly, amplitude component signal A"(t) obtained from amplitude component signal A(t) by converting the sampling rate in the circuit in FIG. 11 or FIG. 12, is multiplied with phase-modulated signal P(t) by multiplier 17. The signal resulting from this multiplication, e"(t) is represented by the following expression 18, where A(t) in the above Ex. 4 is replaced by A"(t).

[Math 18]

$$e''(t) = A''(t) \cdot \cos\{2\pi f_c t + \theta(t)\} = A''(t) \cdot P(t) \quad \text{(Ex. 18)}$$

Here, P(t) in the above Ex. 18 is identical to the above Ex. 5.

First, the transmission circuit shown in FIG. 3 in which sampling rate-convertible delta-sigma modulating circuit 12 is replaced by sample and hold circuit 21 shown in FIG. 11 includes no interpolating circuit 107 according to the present invention. Accordingly, when amplitude component signal A"(t) is multiplied with phase-modulated signal P(t) at multiplier 17, phase-modulated signal P(t) continuously varies (the phase rotates) in performing sampling ($\Delta t=1/fs$) at frequency fs, whereas amplitude component signal A"(t) changes stepwise every N samples or in this example, every 4 samples.

In contrast to this, in the transmission circuit shown in FIG. 3 in which sampling rate-convertible delta-sigma modulating circuit 12 is replaced by interpolating circuit 22 shown in FIG. 12, includes interpolating circuit 107 according to the present invention. Accordingly, amplitude component signal A"(t) is formed into a signal that has been approximately interpolated. Accordingly, when amplitude component signal A"(t) is multiplied with phase-modulated signal P(t) at multiplier 17, amplitude component signal A"(t) is continuously variable in sampling ($\Delta t=1/fs$) at frequency fs.

The above described difference arising between presence and absence of interpolating circuit 107 according to the invention when no delta-sigma modulator is provided, is shown by FIG. 13-a and FIG. 13-b. FIGS. 13-a and 13-b plot signal waveforms (in part) of the signal obtained by multiplying the amplitude component signal A"(t) with its sampling rate converted and phase-modulated signal P(t) by multiplier 17, on the orthogonal coordinate plane. FIG. 13-a shows an example of sample and hold circuit 21 shown in FIG. 11 where no interpolating circuit 107 of the present invention is provided. FIG. 13-b shows an example of interpolating circuit 22 shown in FIG. 12 where interpolating circuit 107 of the present invention is provided.

As shown in FIG. 13-a, in the signal waveform when no interpolating circuit 107 of the present invention is provided, the amplitude varies stepwise for every four samples though the phase continuously rotates for every sample. From this, it is understood that the signal waveform shown in FIG. 13-a greatly differs from the trace that should be present.

In contrast, as shown in FIG. 13-b, in the signal waveform when interpolating circuit 107 of the present invention is provided, the phase continuously rotates for every sampling while the amplitude also varies almost continuously for every sampling.

Figure 14:
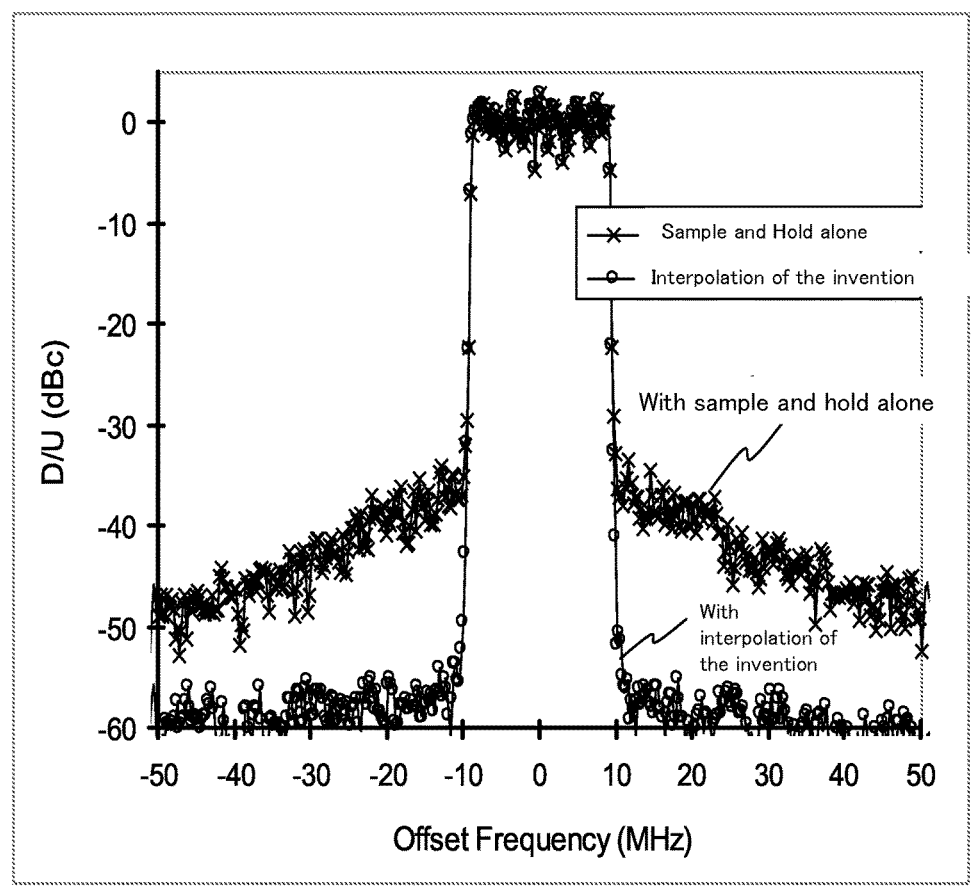
FIG. 14 A diagram showing spectrum waveforms of the signal shown in FIG. 13-a and the signal shown in FIG. 13-b.

FIG. 14 shows spectrum waveforms of the signals shown in FIGS. 13-a and 13-b.

As shown in FIG. 14, in the case of sample and hold circuit 21 including no interpolating circuit 107 of the present invention, distortion arises due to the aforementioned deviation from the trace that should be present, the component of this distortion near the carrier is understood to correspond to the noise near the carrier in FIG. 10.

This distortion is not non-linear but depends on the change rate of the amplitude. As to influence of this distortion, in the case of a narrow band, the change of the amplitude with respect to sampling is gentle, so that influence of deviation from the trace that should be present becomes relatively small, hence making distortion small.

On the other hand, when interpolating circuit 107 of the present invention is provided, the interpolating process is implemented in the small-scale circuit through it is loosely done as stated above. Therefore, distortion can not be totally eliminated but can be reduced to a low enough level compared to the quantization noise arising in delta-sigma modulation.

As described heretofore, in order to achieve an ideal interpolating process in the related art, it has been necessary to construct a high-order filtering circuit by using digital RF circuits that operate based on a clock of some GHz. However, since it is extremely difficult to realize such architect use with digital RF circuits, interpolating circuit 107 that is proposed by the present invention, which can be realized with a small-scale circuit, is markedly effective.

Figure 15:
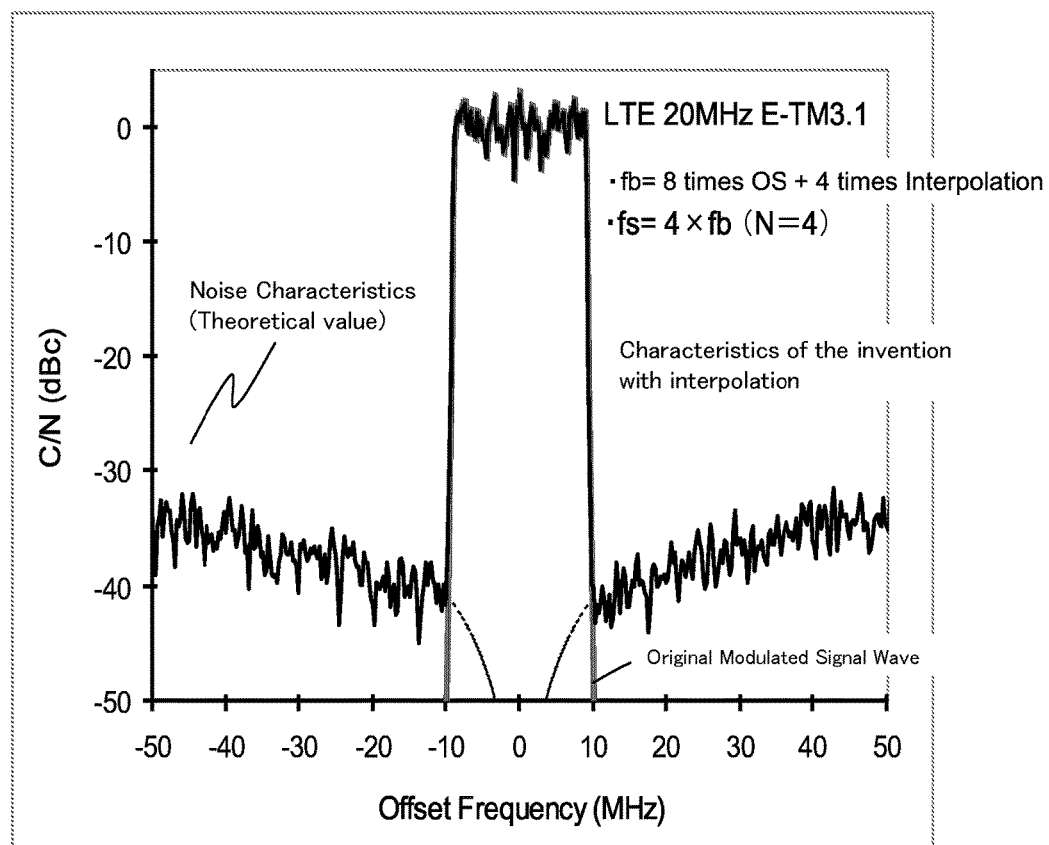
FIG. 15 A diagram showing a spectrum waveform of the output signal from multiplier 17 for LTE 20 MHz OFDMA signals, in the transmission circuit using sampling rate-convertible delta-sigma modulating circuit 12 shown in FIG. 4.

Finally, FIG. 15 shows one example of a spectrum waveform (modulated carrier-to-noise ratio=C/N ratio) of the output signal from multiplier 17, in the transmission circuit shown in FIG. 3 that uses sampling rate-convertible delta-sigma modulating circuit 12 equipped with interpolating circuit 107 according to the present invention.

In the example of FIG. 15, as the input signal to digital baseband signal generator 10, a LTE OFDMA signal (E-UTRA test model 3.1) having a channel bandwidth of 20 MHz in 3GPP E-UTRA, is used. Here, the condition in FIG. 15 is the same as that described with FIG. 10 except that interpolating circuit 107 is provided.

As shown in FIG. 15, in the case of the transmission circuit of this exemplary embodiment, it is understood that the above-described distortion that appears around the carrier shown in FIG. 10, is reformed, hence noise characteristics comparable to the theoretical value in delta-sigma modulator can be obtained. Accordingly, quantization noise that has been shifted to the high frequency side by virtue of the noise shaping characteristics of delta-sigma modulator 113 can be reduced through band pass filter 19 downstream of switching amplifier 18. As a result, it is possible to satisfy the desired radio characteristics.

As described heretofore, according to the transmission circuit of the present exemplary embodiment, it is possible to reduce quantization noise by use of a small-scale circuit as is. Further, it is possible to synchronize the sampling clock for delta-sigma modulation with the carrier wave and with the actual data of the amplitude component signal input to the delta-sigma modulator.

(4) Other Exemplary Embodiments

Although the present invention has been explained with reference to the exemplary embodiments, the present invention should not be limited to the above exemplary embodiments. Various modifications that can be understood by those skilled in the art may be made to the structures and details of the present invention within the scope of the present invention.

For example, through FIG. 4 shows an example in which delta-sigma modulator 113 is realized with a first order delta-sigma modulator, delta-sigma modulator 113 may be realized with a high order delta-sigma modulator. The effect of the present invention can be obtained without regard to the order of delta-sigma modulator 113. It should be noted that use of a high order delta-sigma modulator will not necessitate any change of peripheral configurations.

Further, provision of a circuit for altering N in the multiplier coefficient 1/N in multiplier coefficient retainer 106 and the N-frequency divided clock of frequency divider 115 may be considered. This makes it possible to deal with arbitrary fb and fs.

Moreover, as stated above, in order to make interpolating circuit 107 perform an ideal interpolating process in the related art, it has been necessary to configure a high-order filter circuit by using digital RF circuits that operate based on a clock of some GHz. However, since its realization is extremely difficult, FIG. 4 shows an example of interpolating circuit 107 that can be realized by using a small-scale circuit. However, it goes without saying that, if the circuit is allowed to be large, use of a high-order filter circuit to perform the interpolating process should be included in the configuration of the present invention.

This application claims priority based on Japanese Patent Application No. 2013-115437, filed on May 31, 2013, and should incorporate all the disclosure thereof herein.

The invention claimed is:

1. A transmission circuit comprising:
a delta-sigma modulator that performs delta-sigma modulation on an amplitude component signal of a baseband signal to output an amplitude pulse-modulated signal, an orthogonal modulator that performs orthogonal modulation on an angular component signal of the baseband signal with a carrier wave to output a phase-modulated signal, and a first multiplier that multiplies the amplitude pulse-modulated signal and the phase-modulated signal to output the result of the multiplication to a power amplifier, the transmission circuit further comprising:
a comparator that converts the phase-modulated signal into a pulse signal; and
an asynchronous clock transfer device and an interpolating circuit, disposed between a baseband clock circuit, based on a baseband clock, and the delta-sigma modulator, wherein
the delta-sigma modulator uses the pulse signal as a sampling clock,
the asynchronous clock transfer device converts the amplitude component signal synchronized with the baseband clock into an amplitude component signal synchronized with an N-frequency divided clock by dividing the frequency of the sampling clock by N, wherein N is a natural number equal to or greater than 2, and outputs the converted amplitude component signal to the interpolating circuit, and
the interpolating circuit interpolates the output signal from the asynchronous clock transfer device, so that the amount of change of one sample in the N-frequency divided clock becomes equal to the amount of change of one sample in the sampling clock, and outputs the interpolated signal to the delta-sigma modulator.

2. The transmission circuit according to claim 1, wherein the asynchronous clock transfer device includes:
a first flip-flop that outputs an amplitude component signal synchronized with the baseband clock as an input side request signal;
a second flip-flop that converts the input side request signal synchronized with the baseband clock into an amplitude component signal synchronized with the N-frequency divided clock and outputs the converted amplitude component signal to the interpolating circuit while outputting the amplitude component signal as an output side acknowledgment signal synchronized with the N-frequency divided clock;
a third flip-flop that converts the output side acknowledgment signal synchronized with the N-frequency divided clock into an input side acknowledgment signal synchronized with the baseband clock and outputs the converted input side acknowledgement signal; and
an inverter circuit that performs a handshake process between the input side request signal and the input side acknowledgment signal.

3. The transmission circuit according to claim 1, wherein the interpolating circuit includes:
a first circuit portion that operates based on the N-frequency divided clock and includes a first adder and a first one-sample delay element;
a second circuit portion that operates based on the sampling clock and includes a second adder and a second one-sample delay element; and
a second multiplier that operates based on the sampling clock, wherein
the first one-sample delay element delays the output signal from the asynchronous clock transfer device by one-sample period,
the first adder subtracts the output signal of the first one-sample delay element from the output signal of the asynchronous clock transfer device, and outputs the result of subtraction,
the second one-sample delay element delays the output signal from the second adder by one-sample period,
the second adder adds the output signal from the first adder and the output signal from the second one-sample delay element and outputs the result of addition, and
the second multiplier multiplies the output signal from the second adder by a multiplier coefficient 1/N and outputs the result of the multiplication to the delta-sigma modulator.

4. The transmission circuit according to claim 3, wherein the N in the N-frequency divided clock and the multiplier coefficient 1/N is altered.

5. The transmission circuit according to claim 1, wherein the angular component signal of the baseband signal is supplied to a digital-to-analog converter and a low pass filter to convert the angular component signal into an analog signal.

6. The transmission circuit according to claim 1, wherein the orthogonal modulator receives a carrier wave frequency provided by an oscillator to convert the angular component signal into the phase-modulated signal.

7. The transmission circuit according to claim 1, wherein the power amplifier amplifies the result of the multiplication from the multiplier into an output signal including quantization noise.

8. The transmission circuit according to claim 7, the transmission circuit further comprising: a band pass filter that attenuates the quantization noise in the output signal from the power amplifier.

9. The transmission circuit according to claim 1, wherein the comparator compares the voltage of the phase-modulated signal with a predetermined threshold in order to convert the phase-modulated signal into the pulse signal.

10. The transmission circuit according to claim 9, wherein the pulse signal has a 50% duty cycle based on the conversion.

11. A method for a transmission circuit, the method comprising:
performing delta-sigma modulation on an amplitude component signal of a baseband signal to output an amplitude pulse-modulated signal;
performing orthogonal modulation on an angular component signal of the baseband signal with a carrier wave to output a phase-modulated signal;
multiplying the amplitude pulse-modulated signal and the phase-modulated signal to output the result of the multiplication;
converting the phase-modulated signal into a pulse signal;
operating the pulse signal as a sampling clock;
converting the amplitude component signal synchronized with a baseband clock into an amplitude component signal synchronized with an N-frequency divided clock by dividing the frequency of the sampling clock by N, wherein N is a natural number equal to or greater than 2, and outputting the converted amplitude component signal; and
interpolating the converted amplitude component signal so that the amount of change of one sample in the N-frequency divided clock becomes equal to the amount of change of one sample in the sampling clock.

12. The method according to claim 11, further comprising:
outputting an amplitude component signal synchronized with the baseband clock as an input side request signal;
converting the input side request signal synchronized with the baseband clock into an amplitude component signal synchronized with the N-frequency divided clock and outputting the converted amplitude component signal while outputting the amplitude component signal as an output side acknowledgment signal synchronized with the N-frequency divided clock;
converting the output side acknowledgment signal synchronized with the N-frequency divided clock into an input side acknowledgment signal synchronized with the baseband clock and outputting the converted input side acknowledgement signal; and
performing a handshake process between the input side request signal and the input side acknowledgment signal.

13. The method according to claim 11, further comprising:
operating a first circuit, based on the N-frequency divided clock, that includes a first adder and a first one-sample delay element;
operating a second circuit, based on the sampling clock, that includes a second adder and a second one-sample delay element;
operating a second multiplier based on the sampling clock;
delaying an output signal from an asynchronous clock transfer device by one-sample period;
subtracting the output signal of the first one-sample delay element from the output signal of the asynchronous clock transfer device and outputting the result of subtraction;
delaying the output signal from the second adder by one-sample period;
adding the output signal from the first adder and the output signal from the second one-sample delay element and outputting the result of addition, and
multiplying the output signal from the second adder by a multiplier coefficient 1/N and outputting the result of the multiplication.

14. The method according to claim 13, further comprising:
altering the N in the N-frequency divided clock and the multiplier coefficient 1/N.

15. The method according to claim 11, further comprising:
supplying the angular component signal of the baseband signal to a digital-to-analog converter and a low pass filter to convert the angular component signal into an analog signal.

16. The method according to claim 11, further comprising:

receiving a carrier wave frequency provided by an oscillator to convert the angular component signal into the phase-modulated signal.

17. The method according to claim 11, further comprising:
amplifying the result of the multiplication from the multiplier into an output signal including quantization noise.

18. The method according to claim 17, further comprising:
attenuating the quantization noise in the output signal from the power amplifier.

19. The method according to claim 11, further comprising:
comparing the voltage of the phase-modulated signal with a predetermined threshold in order to convert the phase-modulated signal into the pulse signal.

20. The method according to claim 19, wherein the pulse signal has a 50% duty cycle based on the conversion.

* * * * *